(12) United States Patent
Ishida et al.

(10) Patent No.: US 11,418,202 B2
(45) Date of Patent: Aug. 16, 2022

(54) OSCILLATOR CIRCUIT AND PHASE LOCKED LOOP

(71) Applicant: SONY SEMICONDUCTOR SOLUTIONS CORPORATION, Kanagawa (JP)

(72) Inventors: Uichi Ishida, Kanagawa (JP); Takashi Nakamura, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 0 days.

(21) Appl. No.: 17/274,431

(22) PCT Filed: Sep. 4, 2019

(86) PCT No.: PCT/JP2019/034804
§ 371 (c)(1),
(2) Date: Mar. 8, 2021

(87) PCT Pub. No.: WO2020/059494
PCT Pub. Date: Mar. 26, 2020

(65) Prior Publication Data
US 2022/0052702 A1 Feb. 17, 2022

(30) Foreign Application Priority Data

Sep. 18, 2018 (JP) .............................. JP2018-174087

(51) Int. Cl.
| H03L 7/099 | (2006.01) |
| --- | --- |
| H03B 5/12 | (2006.01) |
| H03L 7/089 | (2006.01) |
| H03L 7/093 | (2006.01) |
| H03L 7/189 | (2006.01) |

(52) U.S. Cl.
CPC ........... *H03L 7/099* (2013.01); *H03B 5/1215* (2013.01); *H03B 5/1228* (2013.01);
(Continued)

(58) Field of Classification Search
CPC ....... H03L 7/099; H03L 7/0895; H03L 7/093; H03L 7/189; H03B 5/1215; H03B 5/1253
(Continued)

(56) References Cited

U.S. PATENT DOCUMENTS

| 6,462,623 B1 | 10/2002 | Horan et al. | |
| --- | --- | --- | --- |
| 7,109,810 B2 * | 9/2006 | Senthilkumar | ........ H03B 5/368 331/116 R |

(Continued)

FOREIGN PATENT DOCUMENTS

| AU | 5028200 A | 12/2000 |
| --- | --- | --- |
| CN | 102405597 A | 4/2012 |

(Continued)

OTHER PUBLICATIONS

International Search Report and Written Opinion of PCT Application No. PCT/JP2019/034804, dated Nov. 26, 2019, 11 pages of ISRWO.

*Primary Examiner* — Arnold M Kinkead
(74) *Attorney, Agent, or Firm* — Chip Law Group

(57) ABSTRACT

An oscillator circuit includes a current source, an oscillating section, a first capacitor, and a setting section. The current source is coupled to a connection node and causes a current having a current value based on an input voltage to flow from a first power node to the connection node. The oscillating section is on a current path between the connection node and a second power node. The oscillating section oscillates at an oscillation frequency based on a current flowing through the current path. The first capacitor is between the connection node and the second power node. The first capacitor has a capacitance that varies in accordance with a voltage at the connection node. The setting section that performs variation operation based on the voltage at the connection node. The variation operation is (Continued)

operation of varying an impedance between the connection node and the second power node.

11 Claims, 13 Drawing Sheets

(52) U.S. Cl.
CPC ......... *H03B 5/1253* (2013.01); *H03L 7/0895* (2013.01); *H03L 7/093* (2013.01); *H03L 7/189* (2013.01)

(58) Field of Classification Search
USPC .................................. 331/74, 177 V, 36 C
See application file for complete search history.

(56) References Cited

U.S. PATENT DOCUMENTS

| | | | | |
|---|---|---|---|---|
| 7,639,097 B2* | 12/2009 | Tran | ............... | H03B 5/06 331/109 |
| 8,922,287 B2* | 12/2014 | Vilas Boas | ............... | H03B 5/06 331/158 |
| 2009/0051454 A1* | 2/2009 | Yamamoto | ............ | H01L 27/088 331/177 R |
| 2010/0271140 A1 | 10/2010 | Raghunathan et al. | | |
| 2012/0086490 A1 | 4/2012 | Doo et al. | | |
| 2016/0233868 A1 | 8/2016 | Homma et al. | | |

FOREIGN PATENT DOCUMENTS

| | | |
|---|---|---|
| EP | 2425533 A1 | 3/2012 |
| JP | 2008-42339 A | 2/2008 |
| JP | 2008-258538 A | 10/2008 |
| JP | 2012-525105 A | 10/2012 |
| JP | 2018-174087 A | 11/2018 |
| KR | 10-2012-0023717 A | 3/2012 |
| KR | 10-2012-0037333 A | 4/2012 |
| WO | 2000/070766 A1 | 11/2000 |
| WO | 2010/126845 A1 | 11/2010 |
| WO | 2016/072023 A1 | 5/2016 |

\* cited by examiner

| Vtail | SWITCH SW1 | SWITCH SW2 | SWITCH SW3 |
|---|---|---|---|
| $V_{th} \le V_{tail}$ | OFF | OFF | OFF |
| $V1 \le V_{tail} < V_{th}$ | ON | OFF | OFF |
| $V2 \le V_{tail} < V1$ | ON | ON | OFF |
| $V_{tail} < V2$ | ON | ON | ON |

| Vtail | SWITCH SW1 | SWITCH SW2 |
|---|---|---|
| V1 ≤ Vtail < Vth | ON | OFF |
| V2 ≤ Vtail < V1 | OFF | ON |
| Vtail < V2 | ON | ON |

| Vtail | SWITCH SW1 | SWITCH SW2 | SWITCH SW3 |
|---|---|---|---|
| $Vth \leq Vtail$ | ON | ON | ON |
| $V1 \leq Vtail < Vth$ | ON | ON | OFF |
| $V2 \leq Vtail < V1$ | ON | OFF | OFF |
| $Vtail < V2$ | OFF | OFF | OFF |

OSCILLATOR CIRCUIT AND PHASE LOCKED LOOP

CROSS REFERENCE TO RELATED APPLICATIONS

This application is a U.S. National Phase of International Patent Application No. PCT/JP2019/034804 filed on Sep. 4, 2019, which claims priority benefit of Japanese Patent Application No. JP 2018-174087 filed in the Japan Patent Office on Sep. 18, 2018. Each of the above-referenced applications is hereby incorporated herein by reference in its entirety.

TECHNICAL FIELD

The present disclosure relates to an oscillator circuit and a phase locked loop including the oscillator circuit.

BACKGROUND ART

A phase locked loop includes a phase comparator circuit, a loop filter, a voltage-controlled oscillator circuit (VCO: Voltage Controlled Oscillator), etc. For example, PTL 1 discloses a PLL (Phase Locked Loop) that varies a capacitance of a provided VCO decoupling capacitor in accordance with an operation frequency.

CITATION LIST

Patent Literature

PTL 1: Japanese Unexamined Patent Application Publication (Translation of PCT Application) No. 2012-525105

SUMMARY OF THE INVENTION

Incidentally, regarding an electronic circuit, a high power supply rejection ratio (PSRR: Power Supply Rejection Ratio) is desired. An oscillator circuit is also expected to have a high power supply rejection ratio.

It is desirable to provide an oscillator circuit and a phase locked loop that makes it possible to increase a power supply rejection ratio.

An oscillator circuit according to one embodiment of the present disclosure includes a current source, an oscillating section, a first capacitor, and a setting section. The current source is coupled to a connection node. The current source is configured to cause a current having a current value based on an input voltage to flow from a first power node to the connection node. The oscillating section is provided on a current path between the connection node and a second power node. The oscillating section is configured to oscillate at an oscillation frequency based on a current flowing through the current path. The first capacitor is provided between the connection node and the second power node. The first capacitor has a capacitance that varies in accordance with a voltage at the connection node. The setting section is configured to perform variation operation on the basis of the voltage at the connection node. The variation operation is operation of varying an impedance between the connection node and the second power node.

A phase locked loop according to one embodiment of the present disclosure includes a phase comparator circuit, a loop filter, and an oscillator circuit. The phase comparator circuit is configured to compare a phase of a first signal and a phase of a second signal based on a clock signal. The loop filter is configured to generate a control voltage on the basis of a phase comparison result in the phase comparator circuit. The oscillator circuit is configured to generate the clock signal on the basis of the control voltage. The oscillator circuit includes a current source, an oscillating section, a first capacitor, and a setting section. The current source is coupled to a connection node. The current source is configured to cause a current having a current value based on the control voltage to flow from a first power node to the connection node. The oscillating section is provided on a current path between the connection node and a second power node. The oscillating section is configured to oscillate at an oscillation frequency based on a current flowing through the current path and to thereby generate the clock signal. The first capacitor is provided between the connection node and the second power node. The first capacitor has a capacitance that varies in accordance with a voltage at the connection node. The setting section is configured to perform variation operation on the basis of the voltage at the connection node. The variation operation is operation of varying an impedance between the connection node and the second power node.

In the oscillator circuit and the phase locked loop each according to one embodiment of the present disclosure, the current having the current value based on an input voltage flows from the first power node to the connection node. The oscillating section is provided on the current path between the connection node and the second power node. The oscillating section oscillates at the oscillation frequency based on the current flowing through the current path. Further, the first capacitor is provided between the connection node and the second power node. The first capacitor has the capacitance that varies in accordance with the voltage at the connection node. Further, the setting section performs the variation operation on the basis of the voltage at the connection node. The variation operation is operation of varying the impedance between the connection node and the second power node.

MODES FOR CARRYING OUT THE INVENTION

Hereinafter, embodiments of the present disclosure are described in detail with reference to the drawings. Note that the description is given in the following order.
1. First Embodiment
2. Second Embodiment

1. First Embodiment

[Configuration Example]

Figure 1:
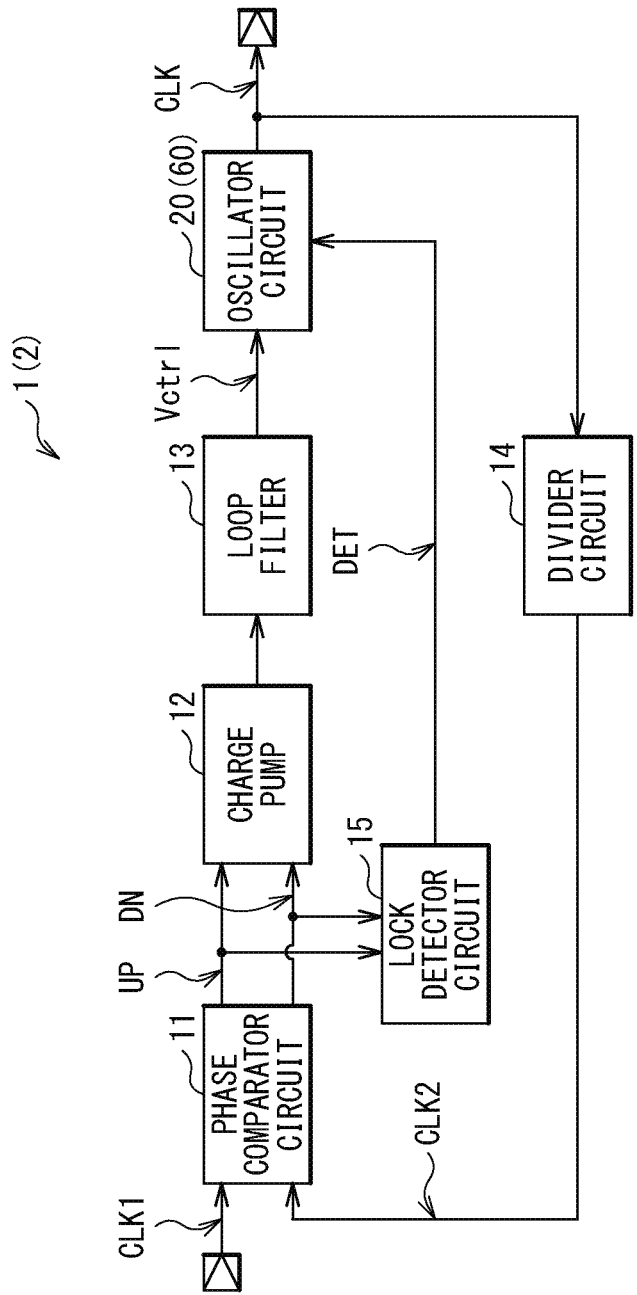
FIG. 1 is a block diagram illustrating a configuration example of a phase locked loop according to one embodiment of the present disclosure.

FIG. 1 illustrates a configuration example of a phase locked loop (a phase locked loop 1) including an oscillator circuit according to an embodiment. The phase locked loop 1 is configured, for example, to generate a clock signal CLK having a frequency higher than that of a clock signal CLK1 on the basis of the clock signal CLK1. The phase locked loop 1 is provided, for example, on a single semiconductor chip.

The phase locked loop 1 includes a phase comparator circuit 11, a charge pump 12, a loop filter 13, an oscillator circuit 20, a divider circuit 14, and a lock detector circuit 15. Each signal in the phase locked loop 1 may be a single-ended signal or a differential signal.

The phase comparator circuit 11 is configured to compare a phase of the clock signal CLK1 and a phase of a clock signal CLK2 supplied from the divider circuit 14, to generate signals UP and DN based on a result of the comparison. The phase comparator circuit 11 includes, for example, a so-called phase frequency detector (PFD; Phase Frequency Detector).

The charge pump 12 is configured to cause a current to flow into the loop filter 13 or to sink a current from the loop filter 13 on the basis of the signals UP and DN.

The loop filter 13 is configured to generate a control voltage Vctrl on the basis of the current supplied from the charge pump 12.

The oscillator circuit 20 is a voltage control oscillator (VCO; Voltage Controlled Oscillator), and is configured to generate a clock signal CLK having a frequency based on the control voltage Vctrl on the basis of the control voltage Vctrl.

The divider circuit 14 is configured to divide the frequency of the clock signal CLK to generate the clock signal CLK2, on the basis of the clock signal CLK. A division ratio in the divider circuit 14 may be in integers or in non-integers.

The lock detector circuit 15 is configured to detect whether phase synchronization is established in the phase locked loop 1 on the basis of the signals UP and DN. Specifically, in a case where the phase of the clock signal CLK1 and the phase of the clock signal CLK2 are synchronized with each other, the lock detector circuit 15 detects the establishment of phase synchronization. Further, the lock detector circuit 15 supplies a signal DET representing a result of the detection to the oscillator circuit 20. Note that, in this example, the lock detector circuit 15 is configured to operate on the basis of the signals UP and DN. However, this is non-limiting. Alternatively, the lock detector circuit 15 may operate on the basis of the clock signals CLK1 and CLK2, for example.

(Oscillator Circuit 20)

Figure 2:
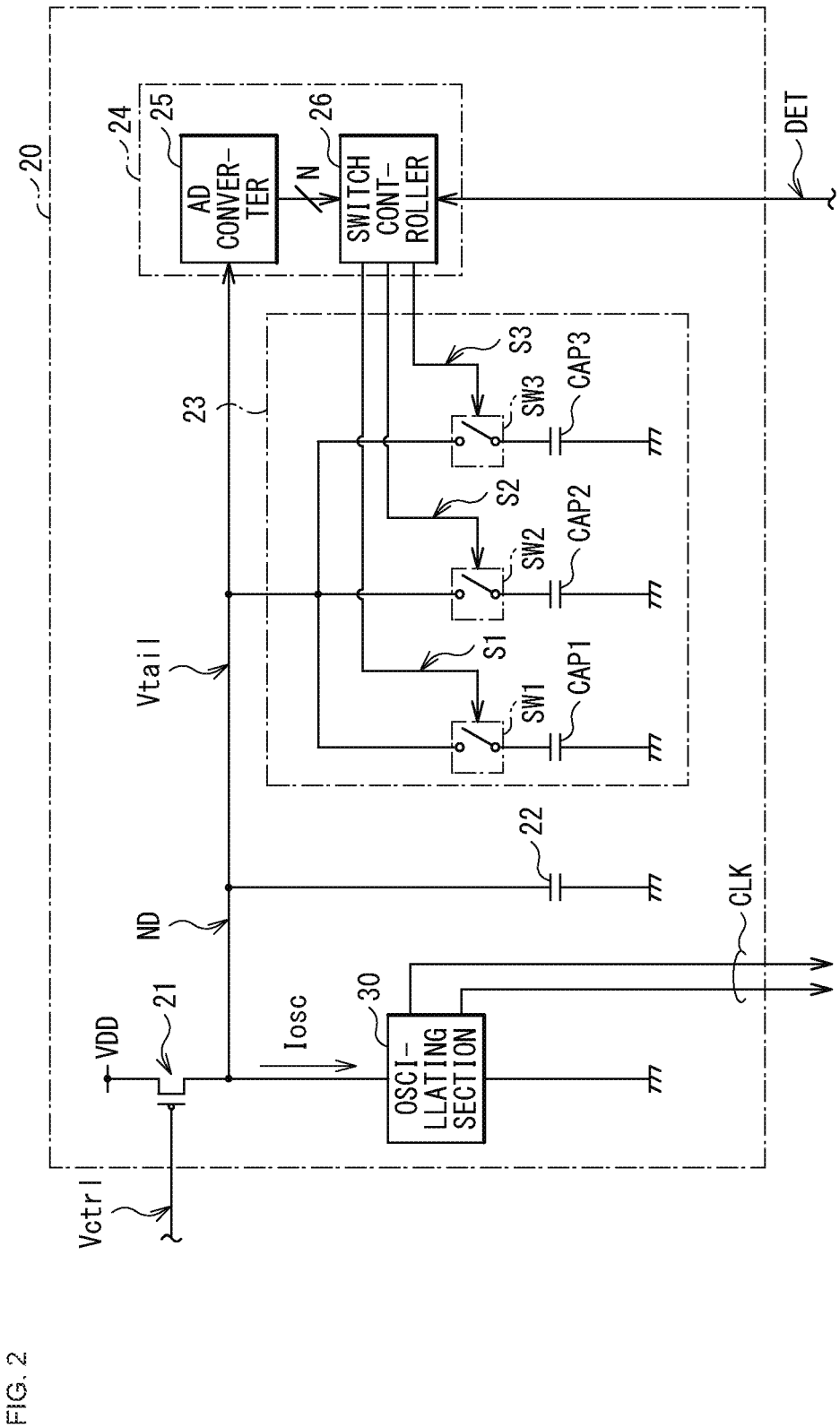
FIG. 2 is a circuit diagram illustrating a configuration example of an oscillator circuit according to a first embodiment.

FIG. 2 illustrates a configuration example of the oscillator circuit 20. The oscillator circuit 20 includes a transistor 21, an oscillating section 30, a capacitor 22, a variable capacitance section 23, and a capacitance setting section 24.

The transistor 21 is a P-type MOS (Metal Oxide Semiconductor) transistor. The transistor 21 has a source that receives a power supply voltage VDD, a gate that receives the control voltage Vctrl, and a drain coupled to a connection node ND. The transistor 21 serves as a current source that generates a current Iosc having a current value based on the control voltage Vctrl. The current Iosc flows into the oscillating section 30 via the connection node ND. As a result, a voltage Vtail is generated at the connection node ND.

The oscillating section 30 is provided on a path between the connection node ND and the ground. The oscillating section 30 is configured to oscillate at an oscillation frequency fosc based on the current Iosc flowing through this path, and to thereby generate the clock signal CLK. In this example, the clock signal CLK is a differential signal.

Figure 3:
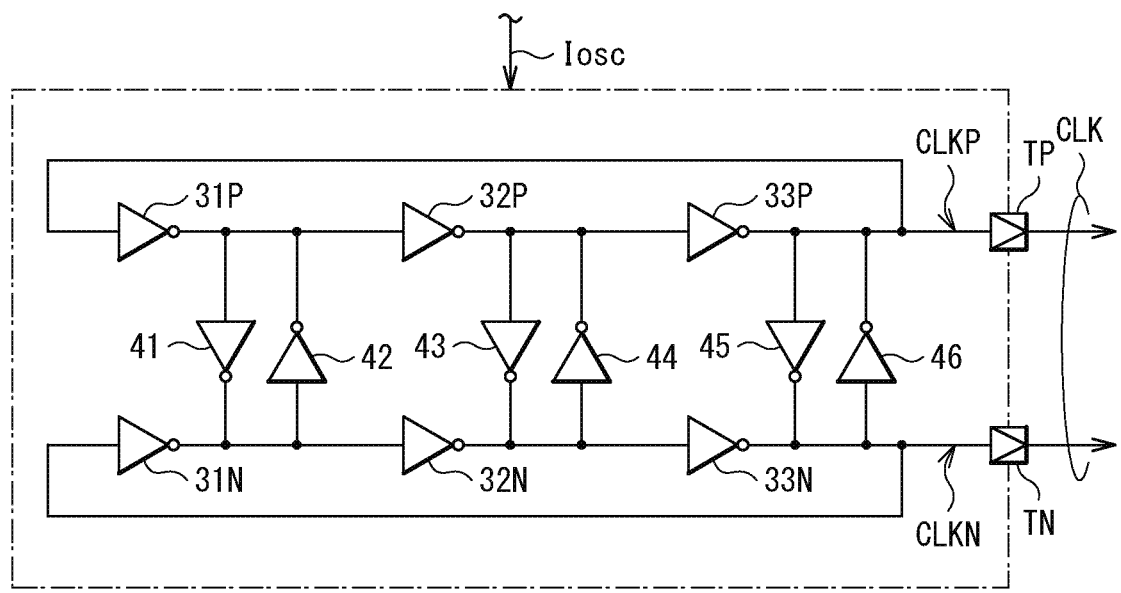
FIG. 3 is a circuit diagram illustrating a configuration example of an oscillating section illustrated in FIG. 2.

FIG. 3 illustrates a configuration example of the oscillating section 30. The oscillating section 30 is a differential ring oscillator. The clock signal CLK includes clock signals CLKP and CLKN configuring a differential signal. The oscillating section 30 outputs the clock signal CLKP from a terminal TP, and outputs the clock signal CLKN from a terminal TN. The oscillating section 30 includes inverters 31P, 32P, 33P, 31N, 32N, 33N, and 41 to 46. These inverters are each a so-called CMOS (Complementary Metal Oxide Semiconductor) inverter including a P-type MOS transistor and an N-type MOS transistor.

An input terminal of the inverter 31P is coupled to the terminal TP and is coupled to an output terminal of the inverter 33P. An output terminal of the inverter 31P is coupled to an input terminal of the inverter 32P. The input terminal of the inverter 32P is coupled to the output terminal of the inverter 31P, and an output terminal of the inverter 32P is coupled to an input terminal of the inverter 33P. The input terminal of the inverter 33P is coupled to the output terminal of the inverter 32P, and an output terminal of the inverter 33P is coupled to the terminal TP and is coupled to the input terminal of the inverter 31P.

An input terminal of the inverter 31N is coupled to the terminal TN and is coupled to an output terminal of the inverter 33N. An output terminal of the inverter 31N is coupled to an input terminal of the inverter 32N. The input terminal of the inverter 32N is coupled to the output terminal of the inverter 31N, and an output terminal of the inverter 32N is coupled to an input terminal of the inverter 33N. The input terminal of the inverter 33N is coupled to the output terminal of the inverter 32N, and an output terminal of the inverter 33N is coupled to the terminal TN and is coupled to the input terminal of the inverter 31N.

An input terminal of the inverter 41 is coupled to the output terminal of the inverter 31P and the input terminal of the inverter 32P, and an output terminal of the inverter 41 is coupled to the output terminal of the inverter 31N and the input terminal of the inverter 32N. An input terminal of the inverter 42 is coupled to the output terminal of the inverter 31N and the input terminal of the inverter 32N, and an output terminal of the inverter 42 is coupled to the output terminal of the inverter 31P and the input terminal of the inverter 32P. An input terminal of the inverter 43 is coupled to the output terminal of the inverter 32P and the input terminal of the inverter 33P, and an output terminal of the inverter 43 is coupled to the output terminal of the inverter 32N and the input terminal of the inverter 33N. An input terminal of the inverter 44 is coupled to the output terminal of the inverter 32N and the input terminal of the inverter 33N, and an output terminal of the inverter 44 is coupled to the output terminal of the inverter 32P and the input terminal of the inverter 33P. An input terminal of the inverter 45 is coupled to the output terminal of the inverter 33P and the input terminal of the inverter 31P, and an output terminal of the inverter 45 is coupled to the output terminal of the inverter 33N and the input terminal of the inverter 31N. An input terminal of the inverter 46 is coupled to the output terminal of the inverter 33N and the input terminal of the inverter 31N, and an output terminal of the inverter 46 is coupled to the output terminal of the inverter 33P and the input terminal of the inverter 31P.

In this example, three stages of inverters (the inverters 31P and 31N, the inverters 32P and 32N, and the inverters 33P and 33N) are used to configure the ring oscillator. However, this is non-limiting. Alternatively, for example, five stages of inverters or seven stages of inverters may be used.

Power supply terminals of the inverters 31P, 32P, 33P, 31N, 32N, 33N, and 41 to 46 are coupled to each other, and are coupled to the connection node ND (FIG. 2). Thus, the current Iosc generated by the transistor 21 flows as a power supply current of these inverters. Accordingly, for example, a delay time of the inverters 31P, 32P, 33P, 31N, 32N, and 33N is varied in accordance with the current Iosc. Specifically, in a case where the current Iosc is small, the delay time becomes long, and in a case where the current Iosc is large, the delay time becomes short. Consequently, in the case where the current Iosc is small, the oscillation frequency fosc becomes low, and in the case where the current Iosc is large, the oscillation frequency fosc becomes high. Thus, the oscillating section 30 serves as a so-called current control oscillator circuit having the oscillation frequency fosc being varied on the basis of the current Iosc.

The capacitor 22 (FIG. 2) serves as a decoupling capacitor of the oscillating section 30. The capacitor 22 has one end coupled to the connection node ND and another end grounded. The capacitor 22 includes a so-called MOS capacitor having a MOS structure. The MOS capacitor has a capacitance per unit area greater than, for example, that of a capacitor having a MIM (Metal Insulator Metal) structure, etc. In the oscillator circuit 20, such use of the MOS capacitor makes it possible to suppress a circuit area.

The variable capacitance section 23 (FIG. 2) is configured to have a capacitance that is variable on the basis of control signals S1 to S3. The variable capacitance section 23 includes switches SW1 to SW3 and capacitors CAP1 to CAP3. The switches SW1 to SW3 include, for example, MOS transistors. The capacitors CAP1 to CAP3 include, for example, MOS capacitors. The capacitors CAP1 to CAP3 have, for example, the same capacitance.

The switch SW1 has one end coupled to the connection node ND and another end coupled to one end of the capacitor CAP1. The switch SW1 is turned on and off on the basis of the control signal S1. The capacitor CAP1 has one end coupled to the other end of the switch SW1 and another end grounded. The switch SW2 has one end coupled to the connection node ND and another end coupled to one end of the capacitor CAP2. The switch SW2 is turned on and off on the basis of the control signal S2. The capacitor CAP2 has one end coupled to the other end of the switch SW2 and another end grounded. The switch SW3 has one end coupled to the connection node ND and another end coupled to one end of the capacitor CAP3. The switch SW3 is turned on and off on the basis of the control signal S3. The capacitor CAP3 has one end coupled to the other end of the switch SW3 and another end grounded.

With this configuration, in the variable capacitance section 23, the number of switches that are turned on among the switches SW1 to SW3 varies on basis of the control signals S1 to S3. Thus, the variable capacitance section 23 is configured to vary the capacitance on the basis of the control signals S1 to S3. Note that, in this example, the three switches SW1 to SW3 are provided. However, this is non-limiting. Alternatively, two switches may be provided, or four or more switches may be provided.

The capacitance setting section 24 is configured to set the capacitance of the variable capacitance section 23 on the basis of the voltage Vtail. The capacitance setting section 24 includes an AD (Analog to Digital) converter 25 and a switch controller 26. The AD converter 25 is configured to convert the voltage Vtail into an N-bit digital code. The switch controller 26 is configured to generate the control signals S1 to S3 on the basis of a digital code supplied from the AD converter 25 and the signal DET supplied from the lock detector circuit 15. Specifically, the switch controller 26 so generates the control signals S1 to S3 that, the lower the voltage Vtail is, the greater the number of the switches that are turned on among the switches SW1 to SW3 is. Thereby, the lower the voltage Vtail is, the more the capacitance setting section 24 increases the capacitance of the variable capacitance section 23. The switch controller 26 holds, for example, table information indicating a correspondence relationship between the digital codes and the control signals S1 to S3. The switch controller 26 uses the table information to generate the control signals S1 to S3 on the basis of the voltage Vtail.

With this configuration, in the oscillator circuit 20, the capacitance of the variable capacitance section 23 is increased in a case where the voltage Vtail is low. By thus increasing the capacitance of the variable capacitance section 23, it is possible to decrease an impedance between the connection node ND and the ground in the oscillator circuit 20. Consequently, in the oscillator circuit 20, as described later, it is possible to improve the power supply rejection ratio.

Here, the transistor 21 corresponds to one specific example of a "current source" of the present disclosure. The oscillating section 30 corresponds to one specific example of an "oscillating section" of the present disclosure. The capacitor 22 corresponds to one specific example of a "first capacitor" of the present disclosure. The capacitance setting section 24 corresponds to one specific example of a "setting section" of the present disclosure. The connection node ND corresponds to one specific example of a "connection node" of the present disclosure. The node that receives the power supply voltage VDD corresponds to one specific example of a "first power node" of the present disclosure. The grounded node corresponds to one specific example of a "second power node" of the present disclosure. The variable capacitance section 23 corresponds to one specific example of a "variable capacitance section" of the present disclosure.

[Operation and Workings]

Subsequently, operation and workings of the phase locked loop 1 according to the present embodiment are described.

(Overview of Overall Operation)

First, referring to FIG. 1, an overview of overall operation of the phase locked loop 1 is described. The phase comparator circuit 11 compares a phase of the clock signal CLK1 and a phase of the clock signal CLK2 supplied from the divider circuit 14, and generates the signals UP and DN in accordance with a result of the comparison. The charge pump 12 causes a current to flow into the loop filter 13 or sinks a current from the loop filter 13 on the basis of the signals UP and DN. The loop filter 13 generates the control voltage Vctrl on the basis of the current supplied from the charge pump 12. The oscillator circuit 20 generates the clock signal CLK having a frequency based on the control voltage Vctrl, on the basis of the control voltage Vctrl. The divider circuit 14 divides the frequency of the clock signal CLK on the basis of the clock signal CLK to generate the clock signal CLK2. The lock detector circuit 15 detects whether or not phase synchronization is established in the phase locked loop 1 on the basis of the signals UP and DN.

(Detailed Operation)

The oscillator circuit 20 generates the clock signal CLK having a frequency based on the control voltage Vctrl, on the basis of the control voltage Vctrl. As illustrated in FIG. 2, the oscillator circuit 20 is provided with the capacitor 22, which is a decoupling capacitor, and thereby improves a power supply rejection ratio.

Incidentally, in the oscillator circuit 20, the capacitor 22 includes a MOS capacitor. A capacitance of the MOS capacitor is voltage-dependent.

Figure 4:
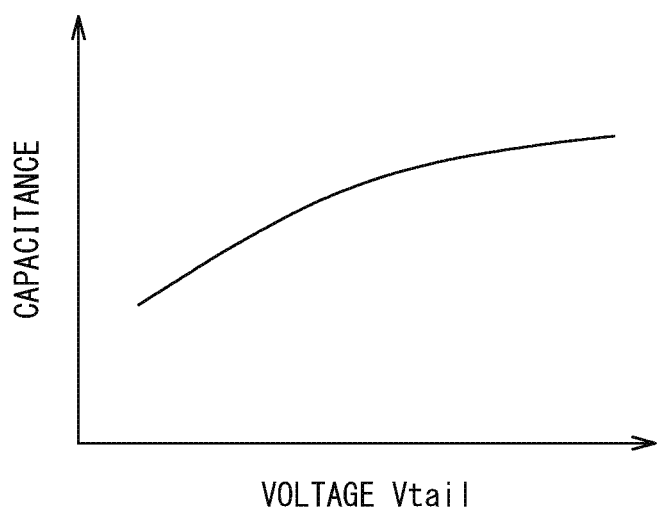
FIG. 4 is a characteristic diagram illustrating a characteristic example of a capacitance of a capacitor illustrated in FIG. 2.

FIG. 4 illustrates an example of the capacitance of the capacitor 22. In FIG. 4, a horizontal axis indicates the voltage Vtail, and a vertical axis indicates the capacitance of the capacitor 22. Because the capacitor 22 is a MOS capacitor, the capacitance can vary depending on a voltage difference between both terminals. Therefore, the capacitance of the capacitor 22 can vary depending on the voltage Vtail. As illustrated in FIG. 4, in this example, in a case where the voltage Vtail is high, the capacitance is high, and in a case where the voltage Vtail is low, the capacitance is low.

As described above, the current Iosc generated by the transistor 21 flows into the oscillating section 30. As a result, the voltage Vtail is generated at the connection node ND. For example, in a case where the current Iosc is small, the voltage Vtail is low, and in a case where the current Iosc is large, the voltage Vtail is high. In other words, in a case where the oscillation frequency fosc is low, the voltage Vtail is low, and in a case where the oscillation frequency fosc is high, the voltage Vtail is high. Therefore, the capacitance of the capacitor 22 can vary according to the oscillation frequency fosc.

Further, the voltage Vtail can vary, for example, as a result of process variations in a semiconductor manufacturing process. Further, the voltage Vtail can vary as a result of power supply voltage variation and temperature variation in causing the phase locked loop 1 to operate. Thus, the capacitance of the capacitor 22 can vary as a result of the process variations, the power supply voltage variation, the temperature variation, etc.

Thus, the voltage Vtail varies in accordance with various factors. Therefore, the capacitance of the capacitor 22 also varies in accordance with various factors. For example, in a case where the capacitance of the capacitor 22 is decreased, the impedance between the connection node ND and the ground is increased. Thus, a power supply rejection ratio can be degraded. In a case where the power supply rejection ratio is low, for example, the power supply voltage fluctuates. Therefore, there is a possibility that phase noise of the clock signal CLK generated by the oscillating section 30 is deteriorated.

Therefore, in the oscillator circuit 20, in a case where the voltage Vtail is low, the capacitance of the variable capacitance section 23 is increased. By thus increasing the capacitance of the variable capacitance section 23, in the oscillator circuit 20, in the oscillator circuit 20, the impedance between the connection node ND and the ground is decreased. Consequently, in the oscillator circuit 20, it is possible to improve a power supply rejection ratio.

Next, setting of the capacitance of the variable capacitance section 23 is described in detail.

Figures 5, 6:
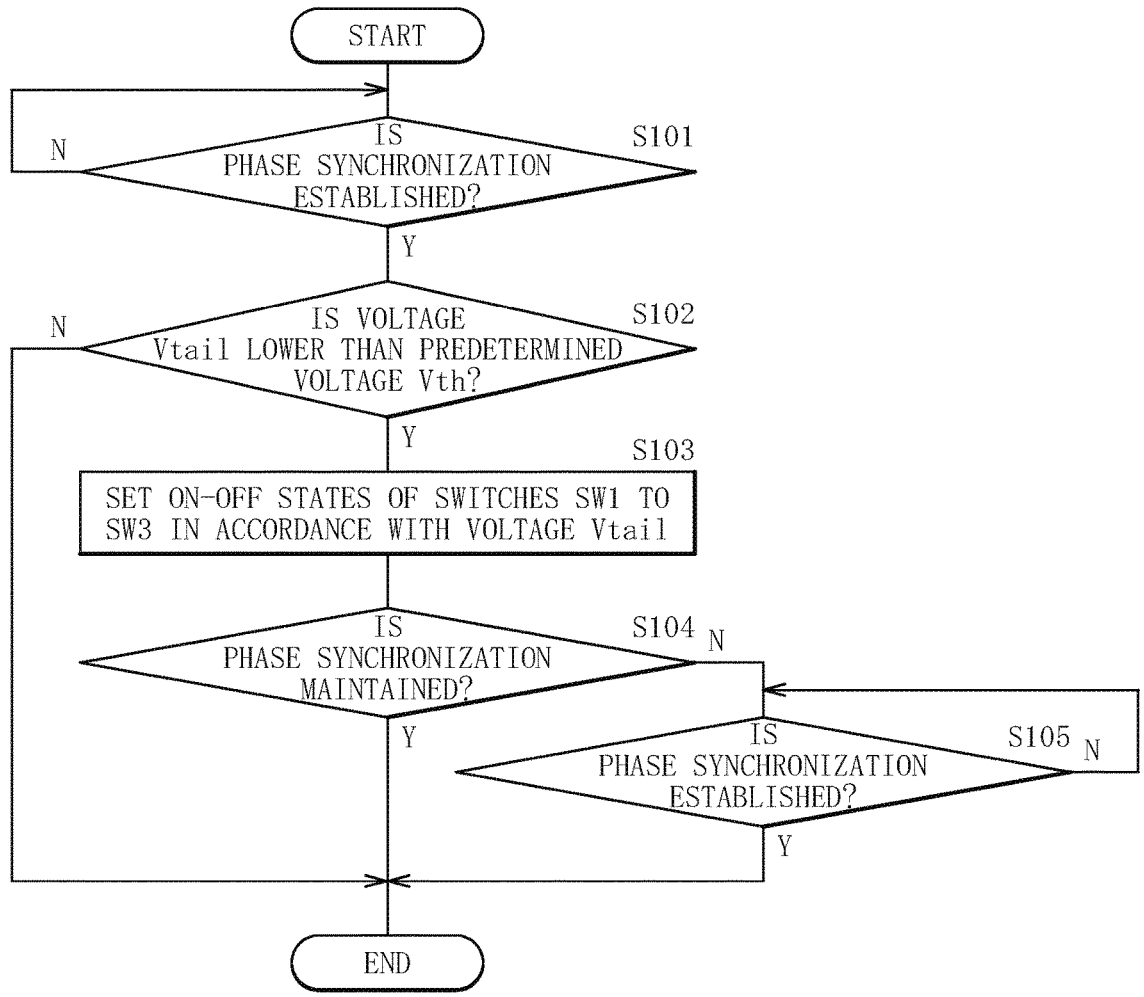
FIG. 5 is a flowchart illustrating an operation example of the oscillator circuit illustrated in FIG. 2.
FIG. 6 is a table describing an operation example of the oscillator circuit illustrated in FIG. 2.

FIG. 5 illustrates an example of operation of setting the capacitance of the variable capacitance section 23. The capacitance setting section 24 varies the capacitance of the variable capacitance section 23 on the basis of the voltage Vtail at the connection node ND. In this example, in an initial state, all of the switches SW1 to SW3 are in an off state. The following describes this operation in detail.

First, the switch controller 26 confirms whether or not phase synchronization is established in the phase locked loop 1 on the basis of the signal DET supplied from the lock detector circuit 15 (step S101). In a case where the phase synchronization is not established ("N" in step S101), the step S101 is repeated until the phase synchronization is established. The phase locked loop 1 performs closed-loop operation. Therefore, the phase synchronization is established after a lapse of time.

In a case where the phase synchronization is established in step S101 ("Y" in step S101), the switch controller 26 confirms whether or not the voltage Vtail is lower than a predetermined voltage Vth on the basis of the digital code supplied from the AD converter 25 (step S102). In a case where it is not lower than the predetermined voltage Vth ("N" in the step S102), this flow is brought to an end.

In a case where the voltage Vtail is lower than the predetermined voltage Vth in step S102 ("Y" in step S102), the switch controller 26 sets the on-off states of the switches SW1 to SW3 in accordance with the voltage Vtail (step S103).

FIG. 6 illustrates an example of operation of setting in the switch controller 26. In a case where the voltage Vtail is equal to or greater than a predetermined voltage V1 and is lower than the predetermined voltage Vth, the switch controller 26 turns on the switch SW1 and turns off the switches SW2 and SW3. Further, in a case where the voltage Vtail is equal to or greater than a predetermined voltage V2 and is lower than the predetermined voltage V1, the switch controller 26 turns on the switches SW1 and SW2, and turns off the switch SW3. Further, in a case where the voltage Vtail is lower than the predetermined voltage V2, the switch controller 26 turns on the switches SW1 to SW3. Thus, the lower the voltage Vtail is, the more the switch controller 26 increases the number of the switches to be turned on among the switches SW1 to SW3. Thus, the lower the voltage Vtail is, the more the switch controller 26 increases the capacitance of the variable capacitance section 23. Consequently, in the oscillator circuit 20, it is possible to prevent the capacitance between the connection node ND and the ground from being excessively small even if the voltage Vtail is decreased. In other words, it is possible to prevent the capacitance between the connection node ND and the ground from varying greatly even if the voltage Vtail varies.

Next, the switch controller 26 confirms whether or not the phase synchronization is maintained, on the basis of the signal DET supplied from the lock detector circuit 15 (step S104). In a case where the phase synchronization is maintained ("Y" in step S104), the flow is brought to an end.

In a case where the phase synchronization is not maintained in step S104 ("N" in step S104), the switch controller 26 confirms whether or not the phase synchronization is established on the basis of the signal DET supplied from the lock detector circuit 15 (step S105). In a case where the phase synchronization is not established ("N" in step S105), it repeats this step S105 until the phase synchronization is established. That is, in a case where the phase synchronization is not maintained in step S104, the phase synchronization is not established. Therefore, it waits until the phase synchronization is established. Because the phase locked loop 1 performs closed-loop operation, the phase synchronization is established after a lapse of time. Further, in a case where the phase synchronization is established ("Y" in step S105), the flow is brought to an end.

As described above, in the phase locked loop 1, the impedance between the connection node ND and the ground is varied on the basis of the voltage Vtail at the connection node ND. Specifically, in the phase locked loop 1, the capacitance of the variable capacitance section 23 is varied in accordance with the voltage Vtail. Thus, in the phase locked loop 1, it is possible to prevent the capacitance between the connection node ND and the ground from being excessively small even if the voltage Vtail decreases. Consequently, with the phase locked loop 1, it is possible to increase a power supply rejection ratio.

Further, in the phase locked loop 1, the capacitance of the variable capacitance section 23 is varied in accordance with the voltage Vtail. In a case where the capacitance of the variable capacitance section 23 is thus varied, a DC operating point before the variation and a DC operating point after the variation are approximately the same. Therefore, by varying the capacitance of the variable capacitance section 23, it is possible to reduce a possibility that the phase synchronization is brought into an unestablished state. Thus, in the phase locked loop 1, when increasing a power supply rejection ratio, it is possible to reduce the possibility that the phase synchronization is brought into an unestablished state.

Further, in the phase locked loop 1, the capacitance of the variable capacitance section 23 is thus varied in accordance with the voltage Vtail. Therefore, it is possible to prevent the capacitance between the connection node ND and the ground from being varied greatly even if the voltage Vtail varies. Thus, even if the decoupling capacitor influences a loop transfer function of the phase locked loop 1, it is possible to reduce a possibility that the influence on the loop transfer function is greatly varied. As a result, in the phase locked loop 1, it is possible to reduce a possibility that a loop response characteristic of the phase locked loop 1 is varied.

[Effects]

As described above, according to the present embodiment, an impedance between a connection node and ground is varied on the basis of a voltage at the connection node. Therefore, it is possible to increase a power supply rejection ratio.

According to the present embodiment, a capacitance of a variable capacitance section is varied in accordance with the voltage Vtail. Accordingly, a DC operating point is allowed to be maintained. Therefore, when increasing a power supply rejection ratio, it is possible to reduce a possibility that the phase synchronization is brought into an unestablished state.

According to the present embodiment, the capacitance of the variable capacitance section is varied in accordance with the voltage Vtail. Accordingly, a range of a possible value of the capacitance between the connection node and the ground is allowed to be narrowed. Therefore, it is possible to reduce the possibility that a loop response characteristic of the phase locked loop varies.

[Modification 1-1]

In the above-described embodiment, as illustrated in FIG. 2, for example, the capacitor CAP1 is provided between the switch SW1 and the ground. However, this is non-limiting. Alternatively, for example, as in an oscillator circuit 20A illustrated in FIG. 7, a disposed position of the capacitor CAP1 and a disposed position of the switch SW1 may be exchanged. The oscillator circuit 20A includes a variable capacitance section 23A. In the variable capacitance section 23A, the capacitor CAP1 has one end coupled to the connection node ND and another end coupled to one end of the switch SW1. The switch SW1 has the one end coupled to the other end of the capacitor CAP1, and another end grounded. This similarly applies to the capacitor CAP2 and the switch SW2. This similarly applies to the capacitor CAP3 and the switch SW3.

Figure 7:
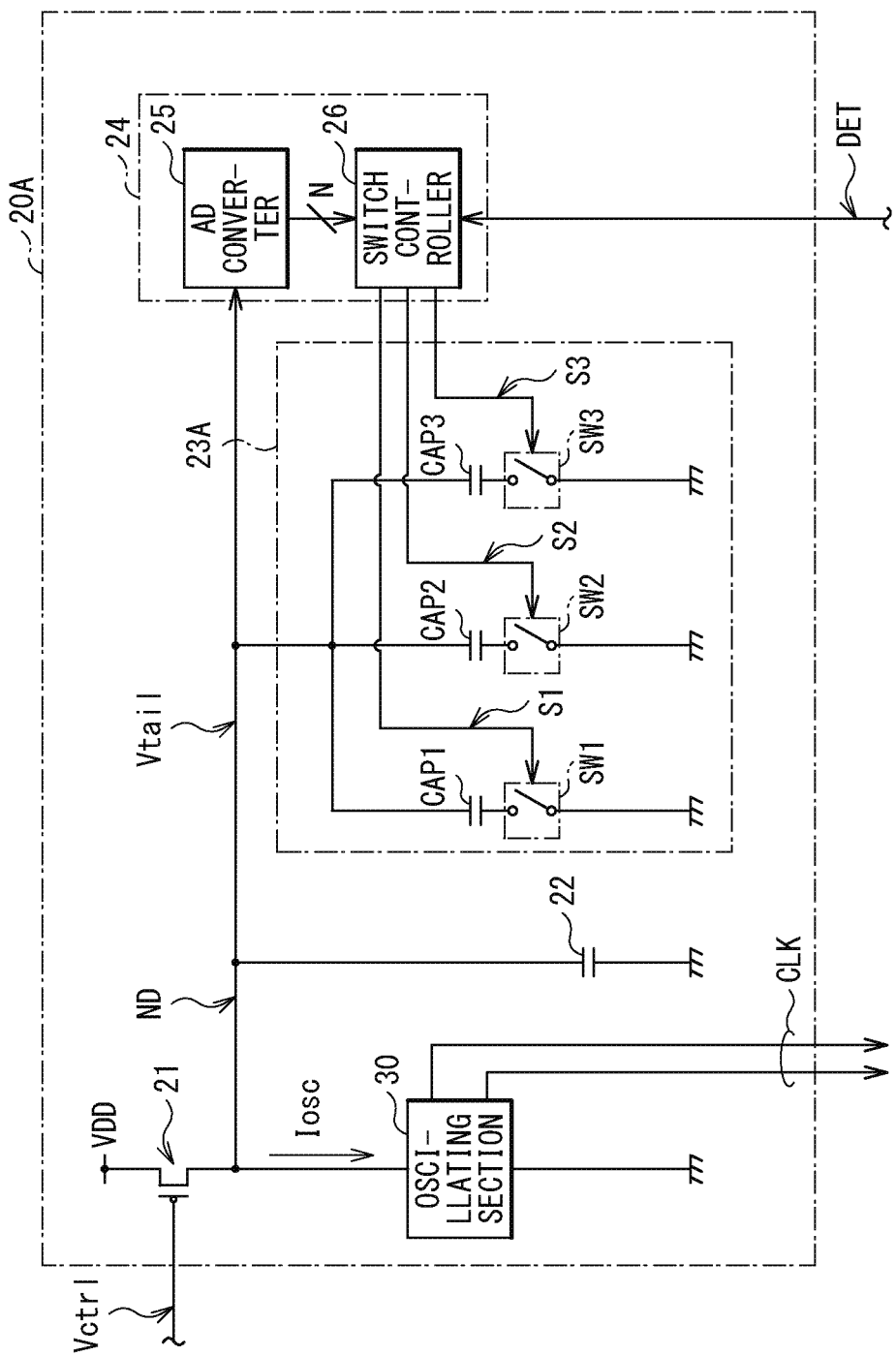
FIG. 7 is a circuit diagram illustrating a configuration example of an oscillator circuit according to a modification of the first embodiment.
Figure 8:
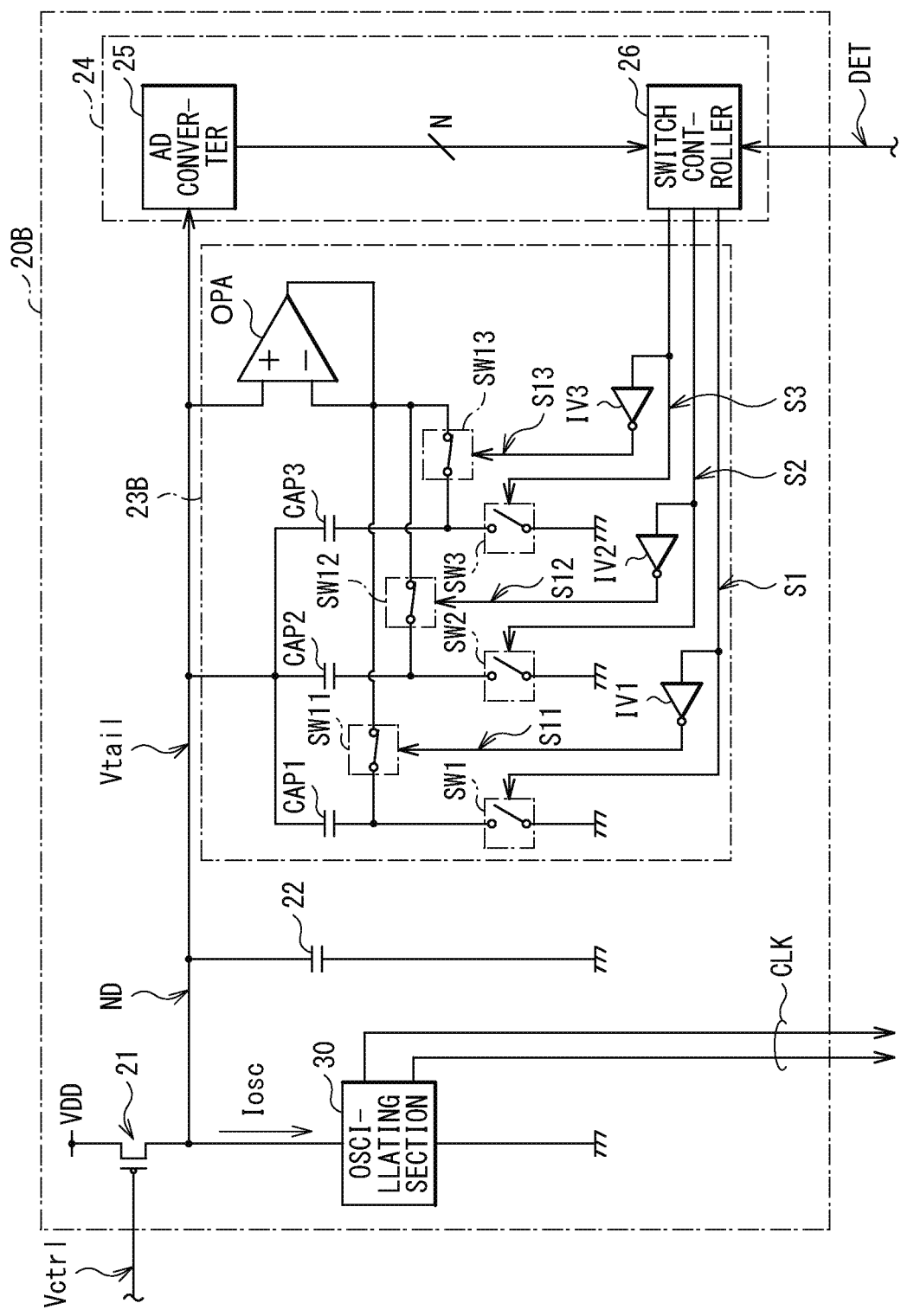
FIG. 8 is a circuit diagram illustrating a configuration example of an oscillator circuit according to another modification of the first embodiment.

In a configuration illustrated in FIG. 7, for example, in a case where the switch SW1 is turned off, the other end of the capacitor CAP1 is brought into a floating state. Therefore, there is a possibility that an unexpected malfunction occurs. Therefore, as in an oscillator circuit 20B illustrated in FIG. 8, it may be configured to avoid such a floating state. The oscillator circuit 20B includes a variable capacitance section 23B. The variable capacitance section 23B includes inverters IV1 to IV3, switches SW11 to SW13, and an operational amplifier (Operational Amplifier) OPA. The inverter IV1 inverts the control signal S1 to generate a control signal S11. The inverter IV2 inverts the control signal S2 to generate a control signal S12. The inverter IV3 inverts the control signal S3 to generate a control signal S13. The switch SW11 has one end coupled to the other end of the capacitor CAP1 and the one end of the switch SW1. The switch SW11 has another end coupled to a negative input terminal and an output terminal of the operational amplifier OPA. The switch SW11 is turned on and off on the basis of the control signal S11. The switch SW12 has one end coupled to the other end of the capacitor CAP2 and the one end of the switch SW2. The switch SW12 has another end coupled to the negative input terminal and the output terminal of the operational amplifier OPA. The switch SW12 is turned on and off on the basis of the control signal S12. The switch SW13 has one end coupled to the other end of the capacitor CAP3 and the one end of the switch SW3. The switch SW12 has another end coupled to the negative input terminal and the output terminal of the operational amplifier OPA. The switch SW13 is turned on and off on the basis of the control signal S13. A positive input terminal of the operational amplifier OPA is coupled to the connection node ND, the negative input terminal of the operational amplifier OPA is coupled to the output terminal of the operational amplifier OPA and the other ends of the switches SW11 to SW13, and the output terminal of the operational amplifier OPA is coupled to the negative input terminal of the operational amplifier OPA and the other ends of the switches SW11 to SW13. The operational amplifier OPA operates as a so-called voltage follower, thereby sets the voltages at the other ends of the switches SW11 to SW13 to voltages approximately the same as the voltage Vtail. For example, in a case where the switch SW1 is turned off, the switch SW11 is turned on. Thus, the other end of the capacitor CAP1 receives the voltage approximately the same as the voltage Vtail. In this manner, in the oscillator circuit 20B, for example, it is possible to prevent the other end of the capacitor CAP1 from being in the floating state, even in a case where the switch SW1 is turned off.

[Modification 1-2]

According to the above-described embodiment, as illustrated in FIG. 2, the variable capacitance section 23 includes the plurality of capacitors CAP1 to CAP3 having the capacitances that are the same as each other. However, this is non-limiting. Alternatively, as in an oscillator circuit 20C illustrated in FIG. 9, the variable capacitance section may include a plurality of capacitors having capacitances different from each other. The oscillator circuit 20C includes a variable capacitance section 23C and a capacitance setting section 24C.

The variable capacitance section 23C includes the switches SW1 and SW2 and the capacitors CAP1 and CAP2. In this example, the capacitance of the capacitor CAP2 is twice as great as the capacitance of the capacitor CAP1. That is, the capacitances of the capacitors CAP1 and CAP2 are weighted. The switch SW1 has one end coupled to the connection node ND and another end coupled to one end of the capacitor CAP1. The capacitor CAP1 has the one end coupled to the other end of the switch SW1 and has another end grounded. The switch SW2 has one end coupled to the connection node ND and another end coupled to one end of the capacitor CAP2. The capacitor CAP2 has the one end coupled to the other end of the switch SW2 and has another end grounded.

Figures 9, 10:
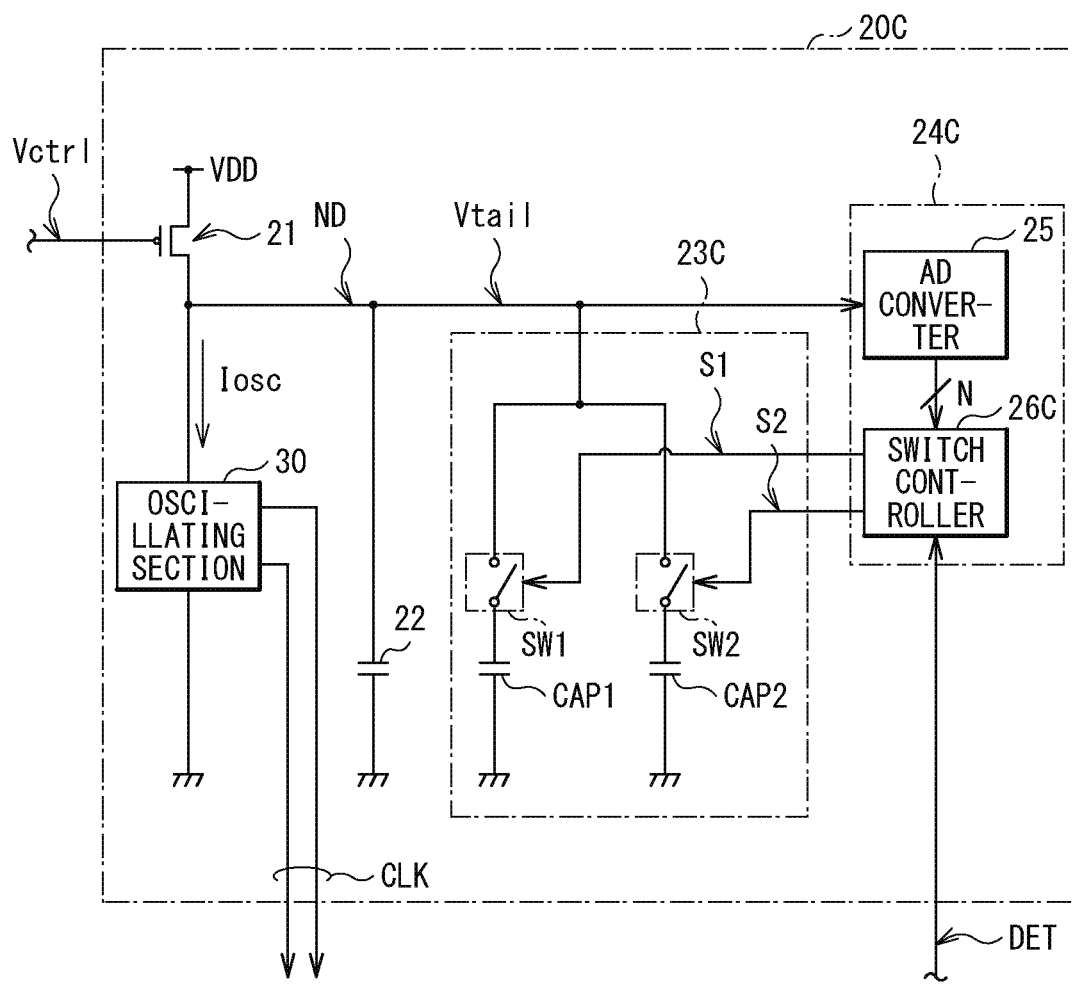
FIG. 9 is a circuit diagram illustrating a configuration example of an oscillator circuit according to another modification of the first embodiment.
FIG. 10 is a table describing an operation example of the oscillator circuit illustrated in FIG. 9.

The capacitance setting section 24C includes a switch controller 26C. The switch controller 26C is configured to generate the control signals S1 and S2 on the basis of the digital code supplied from the AD converter 25 and the signal DET supplied from the lock detector circuit 15. Specifically, as illustrated in FIG. 10, in a case where the voltage Vtail is equal to or greater than the predetermined voltage V1 and is lower than the predetermined voltage Vth, the switch controller 26C turns on the switch SW1 and turns off the switch SW2. Further, in a case where the voltage Vtail is equal to or greater than the predetermined voltage V2 and is lower than the predetermined voltage V1, the switch controller 26C turns off the switch SW1 and turns on the switch SW2. Further, in a case where the voltage Vtail is lower than the predetermined voltage V2, the switch controller 26C turns on the switches SW1 and SW2. Thereby, the lower the voltage Vtail is, the more the switch controller 26C is allowed to increase the capacitance of the variable capacitance section 23C.

[Modification 1-3]

Figure 11:
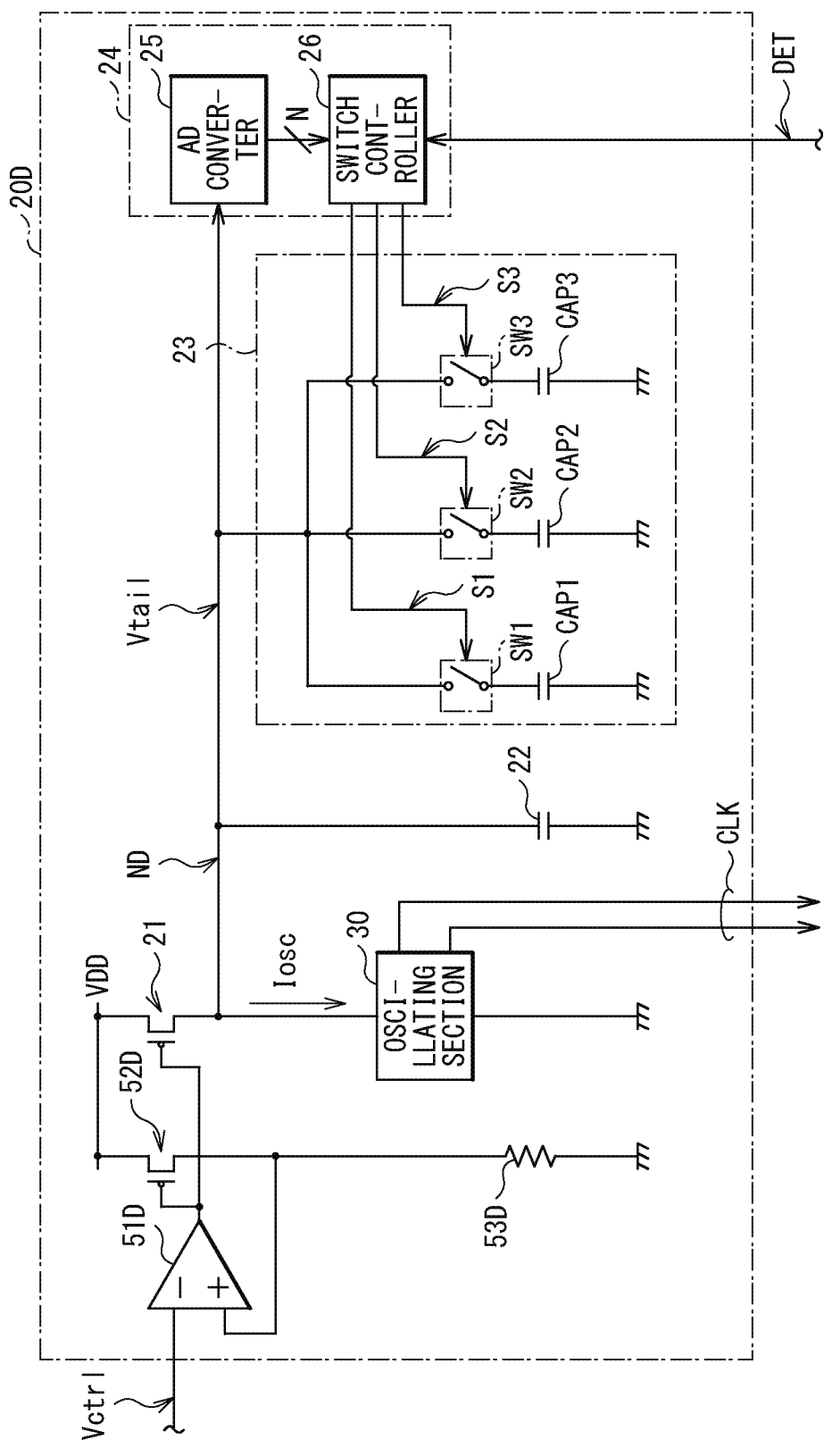
FIG. 11 is a circuit diagram illustrating a configuration example of an oscillator circuit according to another modification of the first embodiment.

According to the above-described embodiment, as illustrated in FIG. 2, the transistor 21 is used to generate the current Iosc on the basis of the control voltage Vctrl. However, this is non-limiting. Alternatively, for example, as in an oscillator circuit 20D illustrated in FIG. 11, a circuit configuration different from that of the above-described embodiment may be used to generate the current Iosc on the basis of the control voltage Vctrl. The oscillator circuit 20D includes an operational amplifier 51D, a transistor 52D, and a resistor 53D. A negative input terminal of the operational amplifier 51D receives the control voltage Vctrl. A positive input terminal of the operational amplifier 51D is coupled to a drain of the transistor 52D and one end of the resistor 53D. An output terminal of the operational amplifier 51D is coupled to gates of the transistors 21 and 52D. The transistor 52D is a P-type MOS transistor. A source of the transistor 52D receives a power voltage VDD. A gate of the transistor 52D is coupled to the output terminal of the operational amplifier 51D and the gate of the transistor 21. A drain of the transistor 52D is coupled to the positive input terminal of the operational amplifier 51D and one end of the resistor 53D. The one end of the resistor 53D is coupled to the positive input terminal of the operational amplifier 51D and the drain of the transistor 52D. The other end of the resistor 53D is grounded. The gate of the transistor 21 is coupled to the output terminal of the operational amplifier 51D and the gate of the transistor 52D. In this example, a gate length of the transistor 52D is the same as a gate length of the transistor 21. A gate width of the transistor 52D is the same as a gate width of the transistor 21. Thus, the transistors 52D and 21 provide a so-called current mirror circuit. Here, the operational amplifier 51D, the transistor 52D, the resistor 53D, and the transistor 21 correspond to one specific example of the "current source" of the present disclosure. With this configuration, the voltage at the one end of the resistor 53D becomes a voltage approximately the same as the control voltage Vctrl. Therefore, a current having a current value approximately the same as a value obtained by dividing the control voltage Vctrl by the resistance of the resistor 53D flows into the transistor 52D. Therefore, the current Iosc having a current value approximately the same as that of the current flowing through the transistor 52D flows in the transistor 21. In this way, the oscillator circuit 20D generates the current Iosc on the basis of the control voltage Vctrl.

[Modification 1-4]

According to the above-described embodiment, the impedance between the connection node ND and the ground is varied on the basis of the voltage at the connection node ND. For example, in a case of a first operation mode, the impedance between the connection node ND and the ground may be varied on the basis of the voltage at the connection node ND, and in a case of a second operation mode, the impedance may not be varied on the basis of the voltage at the connection node ND. Hereinafter, the present modification is described in detail.

Figure 12:
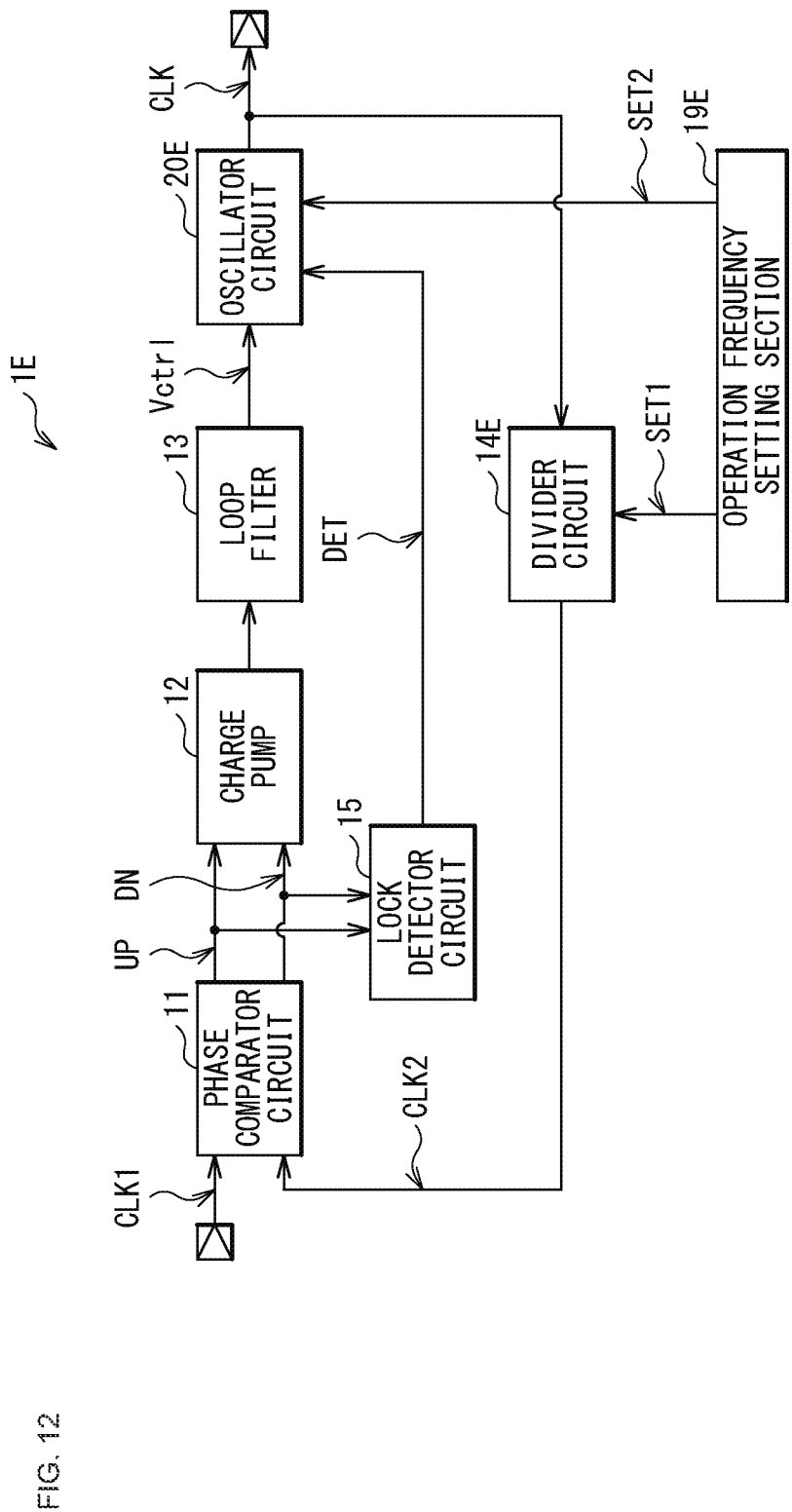
FIG. 12 is a block diagram illustrating a configuration example of a phase locked loop according to another modification of the first embodiment.

FIG. 12 illustrates a configuration example of a phase locked loop 1E according to the present modification. The phase locked loop 1E includes an operation frequency setting section 19E, a divider circuit 14E, and an oscillator circuit 20E.

The operation frequency setting section 19E is configured to set the frequency of the clock signal CLK. The frequency of the clock signal CLK is set in accordance with an application to which the phase locked loop 1E is applied. Further, the operation frequency setting section 19E generates control signals SET1 and SET2 based on the set frequency. The operation frequency setting section 19E supplies the control signal SET1 to the divider circuit 14E, and supplies the control signal SET2 to the oscillator circuit 20E.

The divider circuit 14E sets a division ratio on the basis of the control signal SET1. The divider circuit 14E is configured to divide the frequency of the clock signal CLK at the set division ratio, and to thereby generate the clock signal CLK2. For example, in a case where the frequency of the clock signal CLK is to be increased, the division ratio is set to a large value, and in a case where the frequency of the clock signal CLK is to be decreased, the division ratio is set to a small value.

Figure 13:
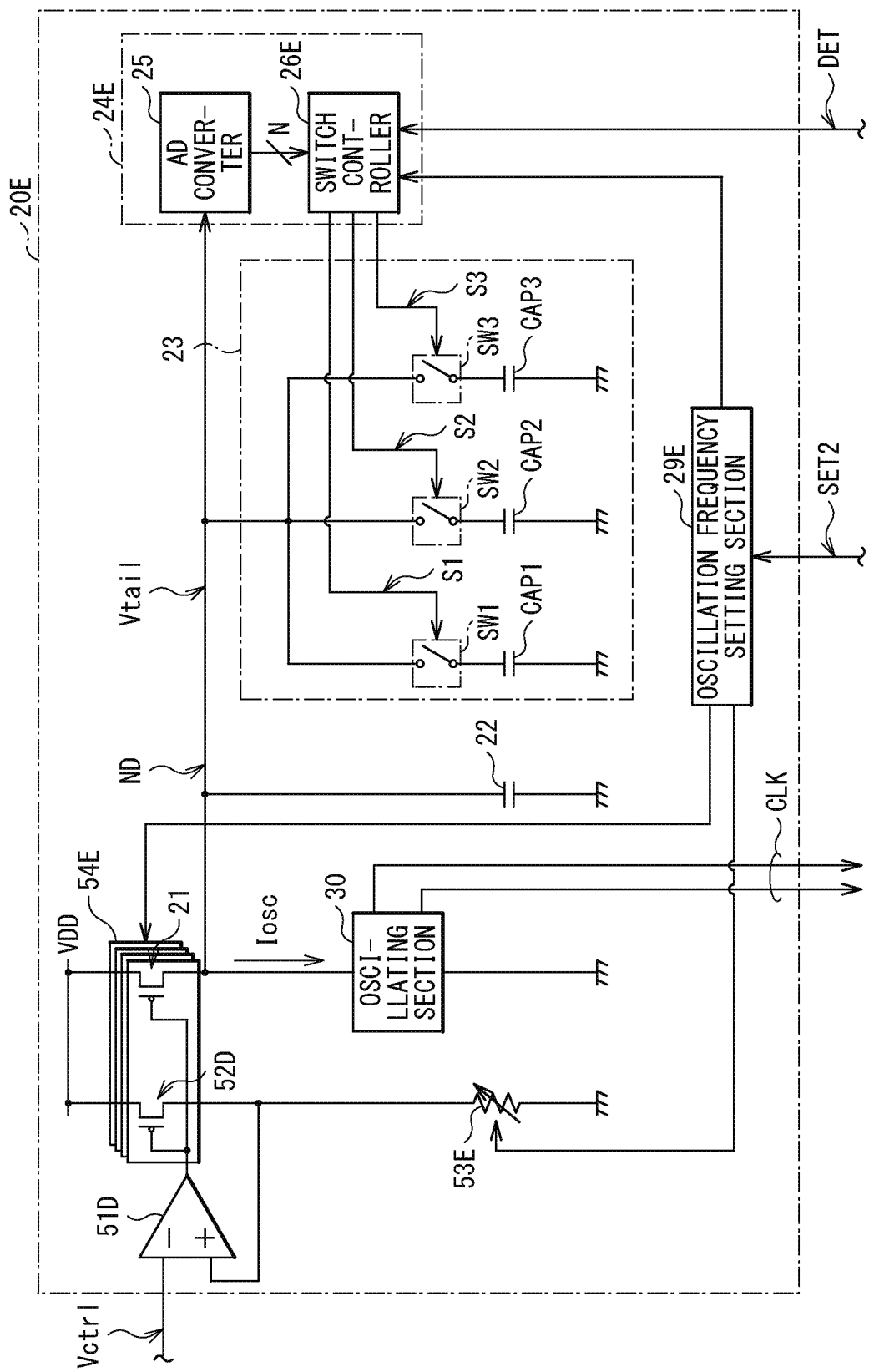
FIG. 13 is a circuit diagram illustrating a configuration example of an oscillator circuit illustrated in FIG. 12.

FIG. 13 illustrates a configuration example of the oscillator circuit 20E. The oscillator circuit 20E includes an oscillation frequency setting section 59E, a variable resistor 53E, a current mirror circuit 54E, and a capacitance setting section 24E.

The oscillation frequency setting section 59E is configured to supply a control signal to the variable resistor 53E, the current mirror circuit 54E, and the capacitance setting section 24E on the basis of the control signal SET2.

The variable resistor 53E is configured to have a resistance that is variable on the basis of the control signal supplied from the oscillation frequency setting section 59E. The variable resistor 53E has one end coupled to the positive input terminal of the operational amplifier 51D and the drain of the transistor 52D in the current mirror circuit 54E. The variable resistor 53E has another end grounded. The resistance is set to a small value in a case where the frequency of the clock signal CLK is to be increased, and is set to a small value in a case where the frequency of the clock signal CLK is to be decreased.

The current mirror circuit 54E includes a plurality of transistors 52D and a plurality of transistors 21. On the basis of the control signal supplied from the oscillation frequency setting section 59E, while maintaining a current mirror ratio, the current mirror circuit 54E is configured to vary the number of the transistors 52D used among the plurality of transistors 52D and vary the number of the transistors 21 used among the plurality of transistors 21. For example, in a case where the frequency of the clock signal CLK is to be increased, the number of the used transistors 52D and the number of the used transistors 21 are increased, and in a case where the frequency of the clock signal CLK is to be decreased, the number of the used transistors 52D and the number of the used transistors 21 are decreased.

The capacitance setting section 24E includes a switch controller 26E. The switch controller 26E determines whether or not to vary the capacitance of the variable capacitance section 23 on the basis of the control signal supplied from the oscillation frequency setting section 59E. For example, in a case where the frequency of the clock signal CLK is to be made higher than a predetermined threshold frequency fth, as in the case of the above-described first embodiment, the switch controller 26E generates the control signals S1 to S3 on the basis of the digital code supplied from the AD converter 25 and the signal DET supplied from the lock detector circuit 15. Further, for example, in a case where the frequency of the clock signal CLK is to be made lower than the predetermined threshold frequency fth, it does not vary the capacitance of the variable capacitance section 23 and maintains the off states of the switches SW1 to SW3.

Here, the operation mode in which the frequency of the clock signal CLK is made higher than the predetermined threshold frequency fth corresponds to one specific example of a "first operation mode" of the present disclosure. The operation mode in which the frequency of the clock signal CLK is made lower than the predetermined threshold frequency fth corresponds to one specific example of a "second operation mode" of the present disclosure.

Thus, in the phase locked loop 1E, in a case where the frequency of the clock signal CLK is to be made higher than the predetermined threshold frequency fth, as in the above-described embodiment, the capacitance of the variable capacitance section 23 is varied on the basis of the voltage at the connection node ND. Therefore, for example, also in a case where the capacitance of the capacitor 22 is varied as a result of the setting of the frequency of the clock signal CLK, process variations, power supply voltage variation, temperature variation, etc., the impedance between the connection node ND and the ground is allowed to be maintained at a low value. Therefore, it is possible to increase a power supply rejection ratio.

Further, in the phase locked loop 1E, in a case where the frequency of the clock signal CLK is to be made lower than the predetermined threshold frequency fth, it is possible to stabilize a loop response characteristic of the phase locked loop 1E. That is, in a case where the frequency of the clock signal CLK is to be decreased, because the resistance of the variable resistor 53E is increased, the current Iosc is decreased. Thus, it is possible to decrease the oscillator frequency fosc in the oscillating section 30. However, in a case where the current Iosc is small in this way, the voltage Vtail at the connection node ND is low. Therefore, in a case where the capacitance of the variable capacitance section 23 is to be increased in accordance with the voltage Vtail as in the case of the above-described embodiment, there is a possibility that the capacitance between the connection node ND and the ground becomes excessively large. In this case, the capacitance greatly influences the loop response characteristic of the phase locked loop 1, and there is a possibility that stability of the loop response characteristic is lowered. Therefore, in the phase locked loop 1E, in a case where the frequency of the clock signal CLK is to be made lower than the predetermined threshold frequency fth, the capacitance of the variable capacitance section 23 is not varied. This leaves the capacitance between the connection node ND and the ground low. This reduces the influence on the loop response characteristic of the phase locked loop 1. Therefore, it is possible to stabilize the loop response characteristic of the phase locked loop 1.

[Other Modifications]

Moreover, two or more of these modifications may be combined.

2. Second Embodiment

Next, a description is given of a phase locked loop 2 having an oscillator circuit according to a second embodiment. The oscillator circuit according to the present embodiment is different from that in the case of the first embodiment described above in a method of varying the impedance between the connection node ND and the ground. Note that components substantially the same as those of the phase locked loop 1 according to the first embodiment described above are denoted with the same reference numerals, and descriptions thereof are omitted as appropriate.

As illustrated in FIG. 1, the phase locked loop 2 includes an oscillator circuit 60.

Figure 14:
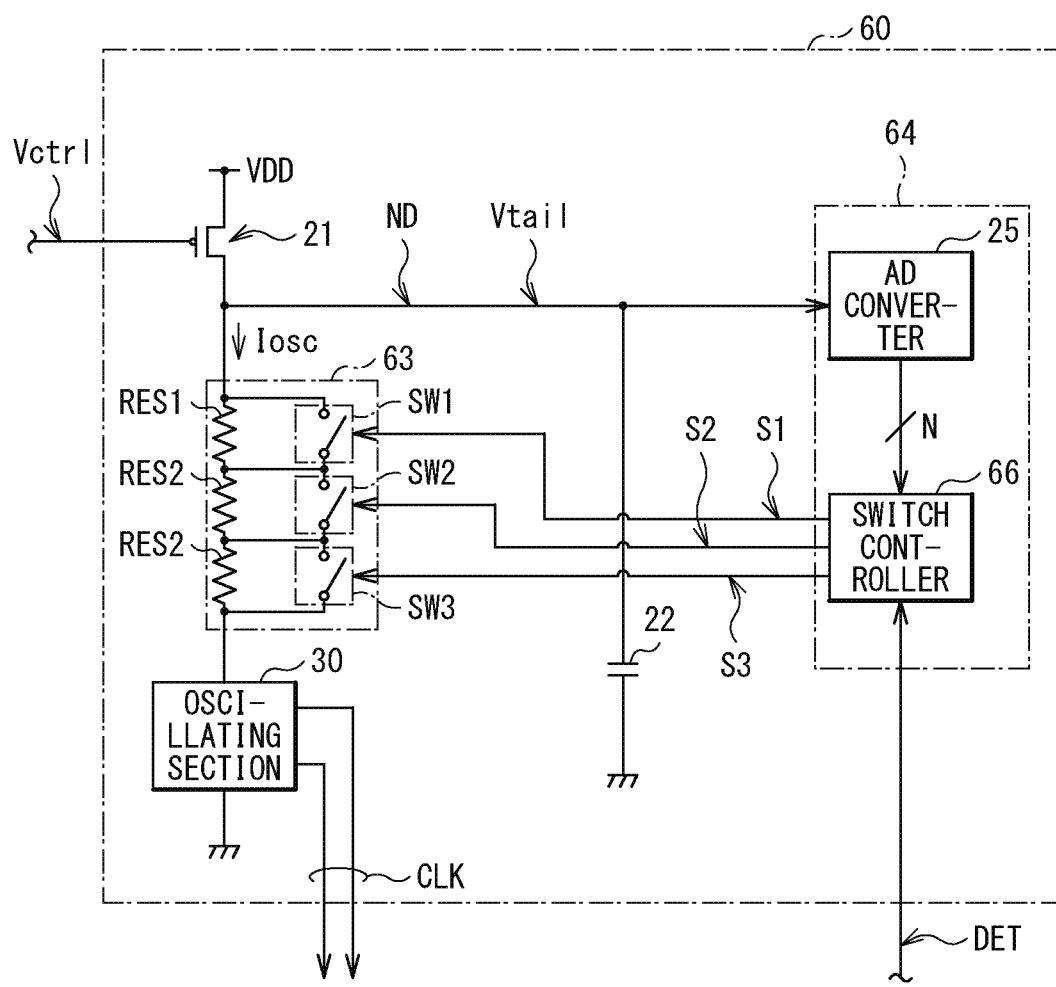
FIG. 14 is a circuit diagram illustrating a configuration example of an oscillator circuit according to a second embodiment.

FIG. 14 illustrates a configuration example of the oscillator circuit 60. The oscillator circuit 60 includes the transistor 21, a variable resistance section 63, the oscillating section 30, the capacitor 22, and a resistance setting section 64.

The variable resistance section 63 is configured to have a resistance that is variable on the basis of the control signals S1 to S3. The variable resistance section 63 includes the switches SW1 to SW3 and resistors RES1 to RES3. The resistors RES1 to RES3 have, for example, the same resistance.

The resistor RES1 has one end coupled to the connection node ND and another end coupled to one end of the resistor RES2. The resistor RES2 has the one end coupled to the other end of the resistor RES1 and another end coupled to one end of the resistor RES3. The resistor RES3 has the one end coupled to the other end of the resistor RES2 and another end coupled to the oscillating section 30.

One end of the switch SW1 is coupled to the one end of the resistor RES1, and another end of the switch SW1 is coupled to the other end of the resistor RES1. One end of the switch SW2 is coupled to the one end of the resistor RES2, and another end of the switch SW2 is coupled to the other end of the resistor RES2. One end of the switch SW3 is coupled to the one end of the resistor RES3, and another end of the switch SW3 is coupled to the other end of the resistor RES3.

With this configuration, the variable resistance section 63 is allowed to vary the resistance on the basis of the control signals S1 to S3.

The resistance setting section 64 is configured to set the resistance of the variable resistance section 63 on the basis of the voltage Vtail. The resistance setting section 64 includes the AD converter 25 and a switch controller 66. The switch controller 66 is configured to generate the control signals S1 to S3 on the basis of the digital code supplied from the AD converter 25 and the signal DET supplied from the lock detector circuit 15. Specifically, the switch controller 66 so generates the control signals S1 to S3 that the lower the voltage Vtail is, the more the number of the switches to be turned on of the switches SW1 to SW3 is decreased. Thus, the lower the voltage Vtail is, the more the resistance setting section 64 increases the resistance of the variable resistance section 63.

With this configuration, in the oscillator circuit 60, the resistance of the variable resistance section 63 is increased in a case where the voltage Vtail is low. In the oscillator circuit 60, an increase in the resistance of the variable resistance section 63 increases a voltage drop at the variable resistance section 63. Thus, the voltage Vtail at the connection node ND increases. The capacitor 22 has a voltage-dependency illustrated in FIG. 4 in this example. Therefore, in the oscillator circuit 60, an increase in the voltage Vtail increases the capacitance of the capacitor 22. Thus, in the oscillator circuit 60, increasing the resistance of the variable resistance section 63 in a case where the voltage Vtail is low allows for an increase in the capacitance of the capacitor 22. This makes it possible to decrease the impedance between the connection node ND and the ground. As a result, in the oscillator circuit 60, it is possible to improve a power supply rejection ratio.

Here, the resistance setting section 64 corresponds to one specific example of the "setting section" of the present disclosure. The variable resistance section 63 corresponds to one specific example of a "variable resistance section" of the present disclosure.

Figures 15, 16:
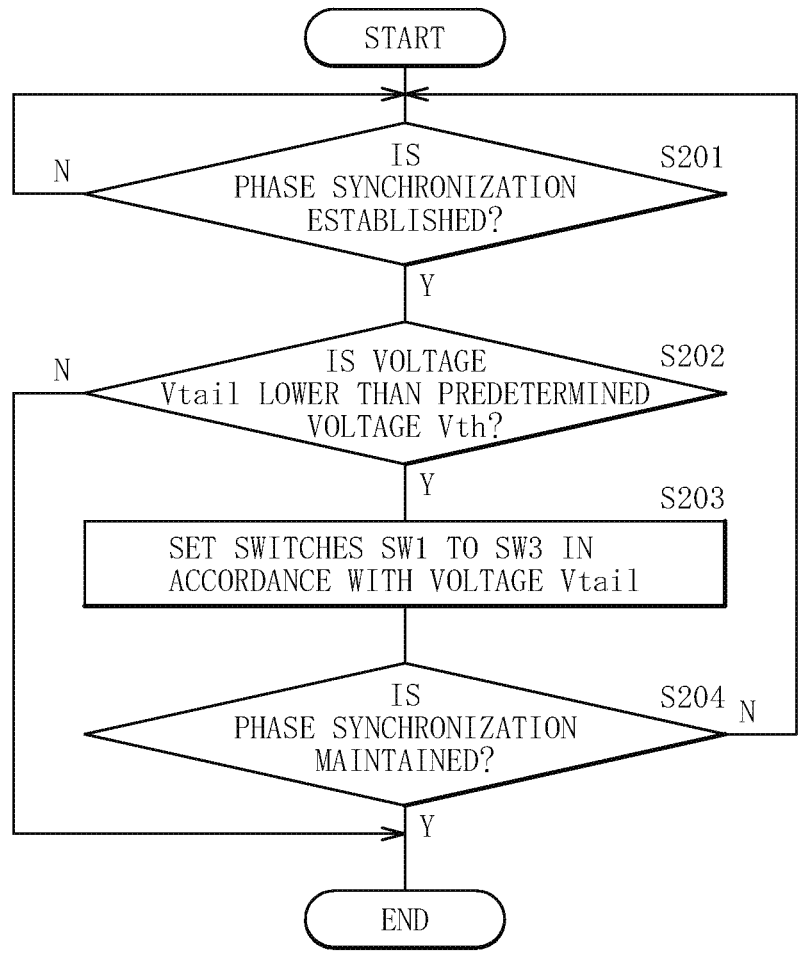
FIG. 15 is a flowchart illustrating an operation example of the oscillator circuit illustrated in FIG. 14.
FIG. 16 is a table describing an operation example of the oscillator circuit illustrated in FIG. 14.

FIG. 15 illustrates an example of operation of setting the resistance of the variable resistance section 63. In this example, in the initial state, all of the switches SW1 to SW3 are in the on state.

First, the switch controller 66 confirms whether or not phase synchronization is established in the phase locked loop 2, on the basis of the signal DET supplied from the lock detector circuit 15 (step S201). In a case where the phase synchronization is not established ("N" in step S201), the switch controller 66 repeats the step S201 until the phase synchronization is established.

In a case where the phase synchronization is established in step S201, ("Y" in step S201), the switch controller 66 confirms whether or not the voltage Vtail is lower than the predetermined voltage Vth on the basis of the digital code supplied from the AD converter 25 (step S202). In a case where it is not lower than the predetermined voltage Vth ("N" in step S202), the flow is brought to an end.

In step S202, in a case where the voltage Vtail is lower than the predetermined voltage Vth ("Y" in step S202), the switch controller 66 sets the on-off states of the switches SW1 to SW3 in accordance with the voltage Vtail (step S203).

FIG. 16 illustrates an example of setting operation of the switch controller 66. In a case where the voltage Vtail is equal to or higher than the predetermined voltage V1 and is lower than the predetermined voltage Vth, the switch controller 66 turns on the switches SW1 and SW2 and turns off the switch SW3. Further, in a case where the voltage Vtail is equal to or higher than the predetermined voltage V2 and is lower than the predetermined voltage V1, the switch controller 26 turns on the switch SW1 and turns off the switches SW2 and SW3. Further, in a case where the voltage Vtail is lower than the predetermined voltage V2, the switch controller 26 turns off the switches SW1 to SW3. As described above, the lower the voltage Vtail is, the more the switch controller 66 increases the number of the switches to be turned off of the switches SW1 to SW3. Thus, the lower the voltage Vtail is, the more the switch controller 66 increases the resistance of the variable resistance section 63. The increase in the resistance of the variable resistance section 63 increases the voltage drop at the variable resistance section 63. Thus, the voltage Vtail at the connection node ND increases and the capacitance of the capacitor 22 increases. As a result, in the oscillator circuit 60, it is possible to prevent the capacitance between the connection node ND and the ground from being excessively small. In other words, it is possible to prevent the capacitance between the connection node ND and the ground from varying greatly.

Next, the switch controller 66 confirms whether or not the phase synchronization is maintained, on the basis of the signal DET supplied from the lock detector circuit 15 (step S204). In a case where the phase synchronization is not maintained ("N" in step S204), the process is caused to return to step S201. Further, the operation in steps S201 to S204 is repeated until the voltage Vtail becomes equal to or higher than the predetermined voltage Vth. In contrast, in a case where the phase synchronization is maintained in step S204 ("Y" in step S204), the flow is brought to an end.

As described above, in the phase locked loop 2, the impedance between the connection node ND and the ground is varied on the basis of the voltage Vtail at the connection node ND. Specifically, in the phase locked loop 2, the resistance of the variable resistance section 63 is varied in accordance with the voltage Vtail. This varies the voltage Vtail at the connection node ND. As a result, the capacitance of the capacitor 22 is varied. Accordingly, in the phase locked loop 2, as in the case of the first embodiment described above, it is possible to increase a power supply rejection ratio.

Moreover, the phase locked loop 2 varies the resistance of the variable resistance section 63, to thereby vary the impedance between the connection node ND and the ground. The area, in the semiconductor chip, of the variable resistance section 63 is allowed to be smaller than the area of the variable capacitance section 23 according to the first embodiment described above (FIG. 2). Therefore, in the phase locked loop 2, it is possible to reduce the circuit area in the semiconductor chip.

As described above, in the present embodiment, the resistance of the variable resistance section is varied, to thereby vary the impedance between the connection node ND and the ground. Therefore, it is possible to reduce the circuit area in the semiconductor chip. Other effects are similar to those in the case of the first embodiment described above.

[Modification 2-1]

Figure 17:
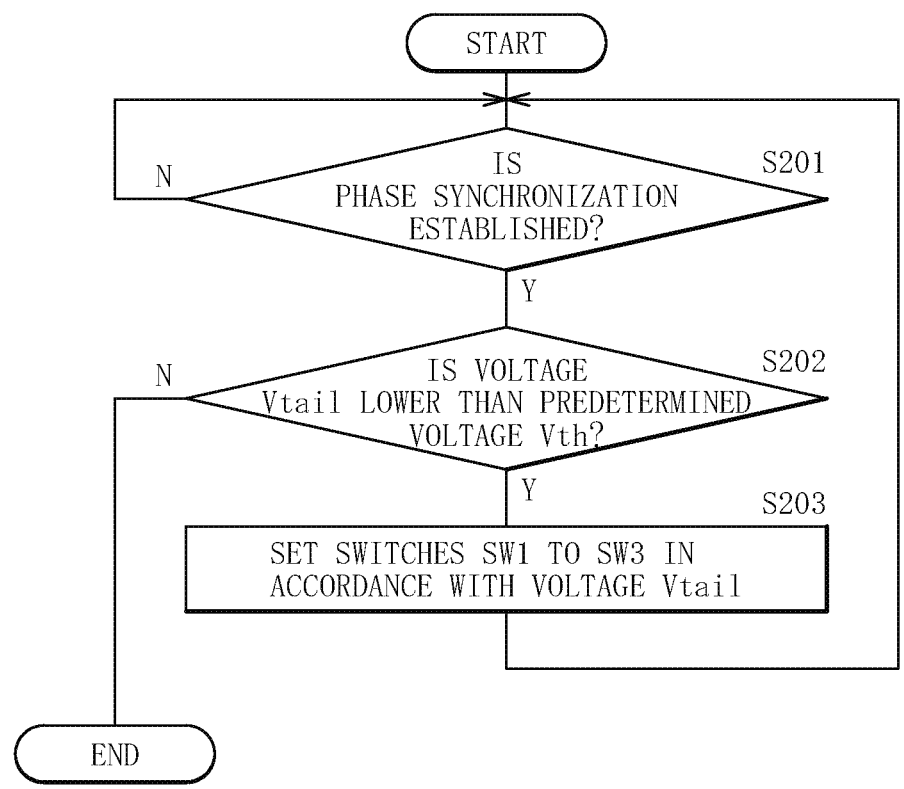
FIG. 17 is a flowchart describing an operation example of an oscillator circuit according to another modification of the second embodiment.

In the above-described embodiment, as illustrated in FIG. 15, whether the phase synchronization is maintained is confirmed in step S204; however, this is non-limiting. Alternatively, for example, as illustrated in FIG. 17, the step S204 may be omitted, and after setting the switches SW1 to SW3 in step S203, it may be caused to return to step S201. That is, in the phase locked loop 2, in a case where the resistance of the variable resistance section 63 is varied in step S203, the DC operating point can be varied. Therefore, there is a high possibility that the phase synchronization is brought into an unestablished state. Therefore, in the phase locked loop 2, the step S204 is omittable.

[Other Modifications]

The modifications of the first embodiment may be applied to the phase locked loop 2 according to the embodiment described above. Specifically, for example, in the oscillator circuit 60, as in the case of the oscillator circuit 20C according to Modification 1-2 of the first embodiment, the resistances of the resistors RES1 to RES3 may be weighted. Further, for example, in the oscillator circuit 60, as in the case of the oscillator circuit 20D (FIG. 11) according to Modification 1-3 of the first embodiment, the operational amplifier 51D, the transistor 52D, and the resistor 53D may be provided. Further, for example, in the phase locked loop 2, as in the case (FIGS. 12 and 13) of the phase locked loop 1E according to Modification 1-4 of the first embodiment, in the case of the first operation mode, the impedance between the connection node ND and the ground may be varied on the basis of the voltage at the connection node ND, and in the case of the second operation mode, the impedance may not be varied on the basis of the voltage at the connection node ND.

Although the present technology has been described with reference to some embodiments and modifications above, the present technology is not limited to these embodiments and the like, and various modifications may be made.

For example, although the divider circuit 14 is provided in each of the embodiments described above, this is non-limiting. Alternatively, for example, the divider circuit 14 may be omitted. In this case, the phase comparator circuit 11 may be configured to compare the phase of the clock signal CLK1 and the phase of the clock signal CLK supplied from the oscillator circuit 20, and to generate the signals UP and DN in accordance with a result of the comparison.

It is to be noted that the effects described herein are merely illustrative and non-limiting, and any other effect may be provided.

It is to be noted that the present technology may be configured as below. According to the present technology having any of the following configurations, it is possible to increase a power supply rejection ratio.

(1)

An oscillator circuit including:

a current source coupled to a connection node, the current source being configured to cause a current having a current value based on an input voltage to flow from a first power node to the connection node;

an oscillating section provided on a current path between the connection node and a second power node, the oscillating section being configured to oscillate at an oscillation frequency based on a current flowing through the current path;

a first capacitor provided between the connection node and the second power node, the first capacitor having a capacitance that varies in accordance with a voltage at the connection node; and a setting section configured to perform variation operation on the basis of the voltage at the connection node, the variation operation being operation of varying an impedance between the connection node and the second power node.

(2)

The oscillator circuit according to (1) described above, further including a variable capacitance section provided between the connection node and the second power node, the variable capacitance section having a variable capacitance, in which the setting section is configured to vary the capacitance of the variable capacitance section to perform the variation operation.

(3)

The oscillator circuit according to (2) described above, in which the setting section is configured to cause the capacitance of the variable capacitance section in a case where the voltage at the connection node is lower than a predetermined threshold to be greater than the capacitance in a case where the voltage at the connection node is higher than the predetermined threshold.

(4)

The oscillator circuit according to claim 2 or 3, in which the variable capacitance section includes two or more sub-circuits coupled in parallel to each other, the sub-circuits each having one end coupled to the connection node and another end coupled to the second power node, the two or more sub-circuits each include a second capacitor and a switch that are coupled in series to each other, and the setting section is configured to vary number of the switches to be turned on of the switches in the two or more sub-circuits, and to thereby vary the capacitance of the variable capacitance section.

(5)

The oscillator circuit according to (2) or (3) described above, further including a variable resistance section provided on the current path, the variable resistance section having a variable resistance, in which the setting section is configured to vary the resistance of the variable resistance section and to thereby perform the variation operation.

(6)

The oscillator circuit according to (5) described above, in which the setting section varies the resistance of the variable resistance section to thereby vary the voltage at the connection node and to vary the capacitance of the first capacitor.

(7)

The oscillator circuit according to (5) or (6) described above, in which the setting section is configured to cause the resistance of the variable resistance section in a case where the voltage at the connection node is lower than a predetermined threshold to be greater than the resistance in a case where the voltage at the connection node is higher than the predetermined threshold.

(8)

The oscillator circuit according to any one of (1) to (7) described above, in which the setting section is configured to perform the variation operation on the basis of the voltage at the connection node in a first operation mode, and is configured not to perform the variation operation in a second operation mode.

(9)

The oscillator circuit according to any one of (1) to (8) described above, in which the capacitance of the first capacitor at time when the voltage at the connection node is a first voltage is greater than the capacitance of the first capacitor at time when the voltage at the connection node is a second voltage, the second voltage being lower than the first voltage.

(10)

The oscillator circuit according to any one of (1) to (9) described above, in which the first capacitor has a MOS structure.

(11)

A phase locked loop including:
a phase comparator circuit configured to compare a phase of a first signal and a phase of a second signal based on a clock signal;
a loop filter configured to generate a control voltage on the basis of a phase comparison result in the phase comparator circuit; and
an oscillator circuit configured to generate the clock signal on the basis of the control voltage,
the oscillator circuit including
a current source coupled to a connection node, the current source being configured to cause a current having a current value based on the control voltage to flow from a first power node to the connection node,
an oscillating section provided on a current path between the connection node and a second power node, the oscillating section being configured to oscillate at an oscillation frequency based on a current flowing through the current path and to thereby generate the clock signal,
a first capacitor provided between the connection node and the second power node, the first capacitor having a capacitance that varies in accordance with a voltage at the connection node, and
a setting section configured to perform variation operation on the basis of the voltage at the connection node, the variation operation being operation of varying an impedance between the connection node and the second power node.

The present application claims priority based on Japanese Patent Application No. 2018-174087 filed with the Japan Patent Office on Sep. 18, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. An oscillator circuit, comprising:
a current source coupled to a connection node, wherein the current source is configured to:
receive input voltage; and
control a flow of a first current from a first power node to the connection node based on the input voltage, and
the first current has a current value corresponding to the input voltage;
an oscillating section on a current path between the connection node and a second power node, wherein the oscillating section is configured to oscillate at an oscillation frequency based on a second current that flows through the current path;
a first capacitor between the connection node and the second power node, wherein the first capacitor has a capacitance that varies based on a voltage at the connection node;
a variable capacitance section between the connection node and the second power node, wherein the variable capacitance section has a capacitance that is variable; and
a setting section configured to:
execute a variation operation to vary the capacitance of the variable capacitance section between a first capacitance and a second capacitance, wherein
the execution of the variation operation is based on the voltage at the connection node,
the capacitance of the variable capacitance section is the first capacitance in a case where the voltage at the connection node is lower than a first threshold voltage,
the capacitance of the variable capacitance section is the second capacitance in a case where the voltage at the connection node is higher than the first threshold voltage, and
the variation operation is an operation of variation of an impedance between the connection node and the second power node; and
control the first capacitance to be greater than the second capacitance.

2. The oscillator circuit according to claim 1, wherein
the variable capacitance section includes at least two sub-circuits,
the at least two sub-circuits include a first sub-circuit and a second sub-circuit,
the first sub-circuit is coupled in parallel with the second sub-circuit,
each sub-circuit of the at least two sub-circuits includes a first end coupled to the connection node and a second end coupled to the second power node,
each sub-circuit of the at least two sub-circuits includes a second capacitor and a switch,
the second capacitor in each sub-circuit of the at least two sub-circuits is coupled in series with the switch in a respective sub-circuit of the at least two sub-circuits,
the at least two sub-circuits includes a plurality of switches, and
the setting section is further configured to vary a number of switches of the plurality of switches that are turned on in the at least two sub-circuits to vary the capacitance of the variable capacitance section.

3. The oscillator circuit according to claim 1, further comprising a variable resistance section on the current path, wherein
the variable resistance section has a resistance that is variable, and
the setting section is further configured to execute the variation operation to vary the resistance of the variable resistance section.

4. The oscillator circuit according to claim 3, wherein the setting section is further configured to:
control variation of the resistance of the variable resistance section; and
vary, based on the control of the variation of the resistance, the voltage at the connection node and the capacitance of the first capacitor.

5. The oscillator circuit according to claim 3, wherein the setting section is further configured to:

control the resistance of the variable resistance section to vary between a first resistance and a second resistance, wherein
the resistance of the variable resistance section is the first resistance in a case where the voltage at the connection node is lower than a second threshold voltage, and
the resistance of the variable resistance section is the second resistance in a case where the voltage at the connection node is higher than the second threshold voltage; and
control the first resistance to be greater than the second resistance.

6. The oscillator circuit according to claim 1, wherein the setting section is further configured to:
execute the variation operation based on the voltage at the connection node in a first operation mode; and
stop the execution of the variation operation in a second operation mode.

7. The oscillator circuit according to claim 1, wherein
the voltage at the connection node is one of a first voltage or a second voltage,
the second voltage is lower than the first voltage,
the capacitance of the first capacitor is one of a third capacitance or a fourth capacitance,
the first capacitor has the third capacitance in a case where the connection node has the first voltage,
the first capacitor has the fourth capacitance in a case where the connection node has the second voltage, and
the third capacitance is greater than the fourth capacitance.

8. The oscillator circuit according to claim 1, wherein the first capacitor has a MOS structure.

9. A phase locked loop, comprising:
a phase comparator circuit configured to compare a phase of a first signal and a phase of a second signal based on a clock signal to generate a phase comparison result;
a loop filter configured to generate a control voltage based on the phase comparison result; and
an oscillator circuit configured to generate the clock signal based on the control voltage, wherein the oscillator circuit includes:
a current source coupled to a connection node, wherein the current source is configured to control a flow of a first current from a first power node to the connection node based on the control voltage, and
the first current has a current value corresponding to the control voltage;
an oscillating section on a current path between the connection node and a second power node, wherein the oscillating section is configured to oscillate at an oscillation frequency based on a second current that flows through the current path;
a first capacitor between the connection node and the second power node, wherein the first capacitor has a capacitance that varies based on a voltage at the connection node;
a variable capacitance section between the connection node and the second power node, wherein the variable capacitance section has a capacitance that is variable; and
a setting section configured to:
execute a variation operation to vary the capacitance of the variable capacitance section between a first capacitance and a second capacitance, wherein
the execution of the variation operation is based on the voltage at the connection node,
the capacitance of the variable capacitance section is the first capacitance in a case where the voltage at the connection node is lower than a threshold voltage,
the capacitance of the variable capacitance section is the second capacitance in a case where the voltage at the connection node is higher than the threshold voltage, and
the variation operation is an operation of variation of an impedance between the connection node and the second power node; and
control the first capacitance to be greater than the second capacitance.

10. An oscillator circuit, comprising:
a current source coupled to a connection node, wherein the current source is configured to:
receive input voltage; and
control a flow of a first current from a first power node to the connection node based on the input voltage, and
the first current has a current value corresponding to the input voltage;
an oscillating section on a current path between the connection node and a second power node, wherein the oscillating section is configured to oscillate at an oscillation frequency based on a second current that flows through the current path;
a first capacitor between the connection node and the second power node, wherein the first capacitor has a capacitance that varies based on a voltage at the connection node;
a variable resistance section on the current path, wherein the variable resistance section has a resistance that is variable; and
a setting section configured to:
execute a variation operation to vary the resistance of the variable resistance section between a first resistance and a second resistance, wherein
the execution of the variation operation is based on the voltage at the connection node,
the resistance of the variable resistance section is the first resistance in a case where the voltage at the connection node is lower than a threshold voltage,
the resistance of the variable resistance section is the second resistance in a case where the voltage at the connection node is higher than the threshold voltage, and
the variation operation is an operation of variation of an impedance between the connection node and the second power node; and
control the first resistance to be greater than the second resistance.

11. An oscillator circuit, comprising:
a current source coupled to a connection node, wherein the current source is configured to:
receive input voltage; and
control a flow of a first current from a first power node to the connection node based on the input voltage, and
the first current has a current value corresponding to the input voltage;
an oscillating section on a current path between the connection node and a second power node, wherein the oscillating section is configured to oscillate at an oscillation frequency based on a second current that flows through the current path;

a first capacitor between the connection node and the second power node, wherein the first capacitor has a capacitance that varies based on a voltage at the connection node, wherein the voltage at the connection node is one of a first voltage or a second voltage, the second voltage is lower than the first voltage, the first capacitor has a first capacitance in a case where the connection node has the first voltage, the first capacitor has a second capacitance in a case where the connection node has the second voltage, and the first capacitance is greater than the second capacitance; and a setting section configured to execute a variation operation based on one of the first voltage or the second voltage at the connection node, wherein the variation operation is an operation of variation of an impedance between the connection node and the second power node.

* * * * *